United States Patent [19]
Toda

[11] Patent Number: 5,121,025
[45] Date of Patent: Jun. 9, 1992

[54] VIBRATOR-TYPE ACTUATOR

[76] Inventor: Kohji Toda, 1-49-18, Futaba, Yokosuka, Japan

[21] Appl. No.: 573,720

[22] Filed: Aug. 28, 1990

[30] Foreign Application Priority Data

| Aug. 31, 1989 | [JP] | Japan | 1-226950 |
| Sep. 28, 1989 | [JP] | Japan | 1-253890 |
| Oct. 4, 1989 | [JP] | Japan | 1-261083 |
| Dec. 8, 1989 | [JP] | Japan | 1-320032 |

[51] Int. Cl.$^5$ .......................................... H01L 41/08
[52] U.S. Cl. ................... 310/358; 310/323; 310/366
[58] Field of Search ............ 310/323, 328, 333, 358, 310/366, 369

[56]  References Cited

U.S. PATENT DOCUMENTS 4,999,536  3/1991  Toda .................................. 310/323
5,008,581  4/1991  Kumada .............................. 310/323

Primary Examiner—Mark O. Budd
Attorney, Agent, or Firm—Cushman, Darby & Cushman

[57] ABSTRACT

A pair of electrodes are formed on both end surfaces of a pillar-shaped piezoelectric body polarized in a longitudinal axial direction thereof. A cover is formed on at least a part of a side surface of the piezoelectric body. The cover is made of material having high wear resistant and large heat conductivity characteristics. The electrode is formed on a part of the end surface. A moving element is pressed against the cover of the piezoelectric body. The cover is secured to supporting means at a portion of the side surface of the cover where a small vibration displacement is caused. Each of the paired electrodes are formed at essentially symmetrical portions with respect to a center point of the piezoelectric body or at asymmetrical portions with respect to a plane perpendicular to the longitudinal direction.

16 Claims, 38 Drawing Sheets

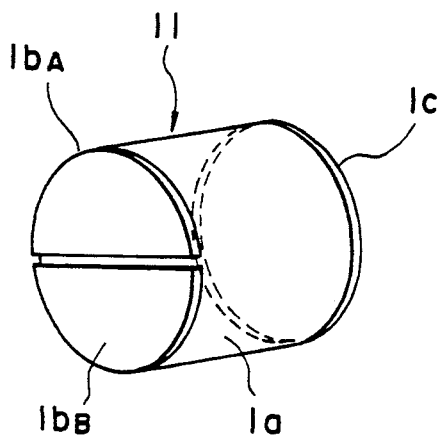
FIG. 1
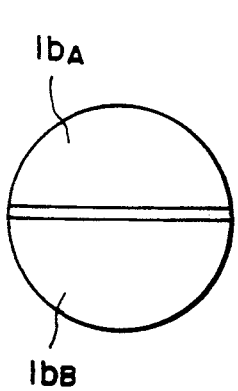 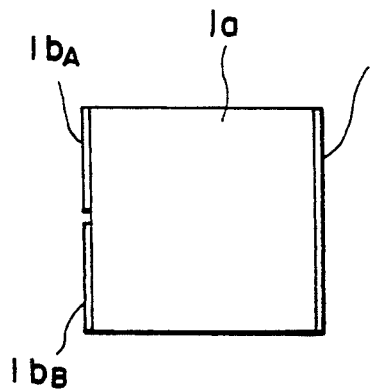 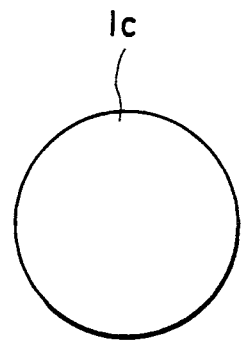
FIG. 2A     FIG. 2B     FIG. 2C

LONGITUDINAL VIBRATION

| MATERIAL | FREQ. | EXPERIMENTAL VALUE (kHz) | THEORETICAL VALUE (kHz) | ERROR (%) |
|---|---|---|---|---|
| 71B-D10-L10 | $f_1$ | 128.0 | 118.5 | 8.0 |
|  | $f_2$ | 201.5 | 220.6 | -8.6 |
| 71B-D10-L7.31 | $f_1$ | 158.0 | 145.5 | 8.6 |
|  | $f_2$ | 225.0 | 247.4 | -9.1 |
| 71B-D5-L10 | $f_1$ | 138.0 | 128.4 | 7.4 |
|  | $f_2$ | 522.4 | 557.0 | -6.2 |
| 71B-D5-L8 | $f_1$ | 163.0 | 157.6 | 3.2 |
|  | $f_2$ | 420.0 | 415.7 | 1.0 |
| 91C-D10-L10 | $f_1$ | 135.0 | 123.3 | 9.4 |
|  | $f_2$ | 215.5 | 235.8 | -8.6 |

FIG. 8

| | $f_r$ kHz | $k_{33}$ % | $d_{33}$ $\times 10^{-12}$ m/V | $g_{33}$ $\times 10^{-3}$ Vm/N | Young's modulus $\times 10^{10}$ N/m | Poison's ratio | Density $\times 10^3$ kg/cm$^3$ | Velocity m/s |
|---|---|---|---|---|---|---|---|---|
| M-71A | 138.3 | 62.7 | 282.9 | 25.8 | 6.1 | 0.28 | 7.6 | 2833.1 |
| M-71B | 129.8 | 71.3 | 339.1 | 32.5 | 5.08 | 0.29 | 7.55 | 2593.9 |
| M-91C | 134.9 | 70.5 | 303.6 | 32.1 | 5.63 | 0.30 | 7.68 | 2707.5 |
| M-71D | 164.2 | 51.8 | 153.4 | 22.8 | 8.07 | 0.32 | 7.49 | 3282.4 |

(d = 2.5mm)

(d = 5mm)

(d = 10mm)

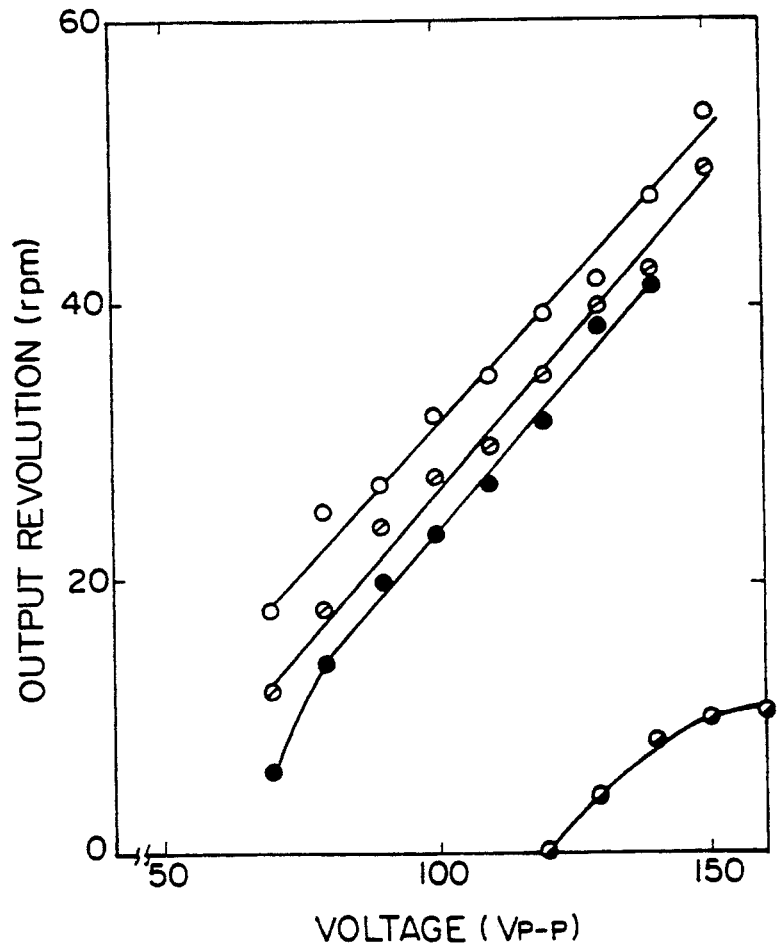
FIG. 64
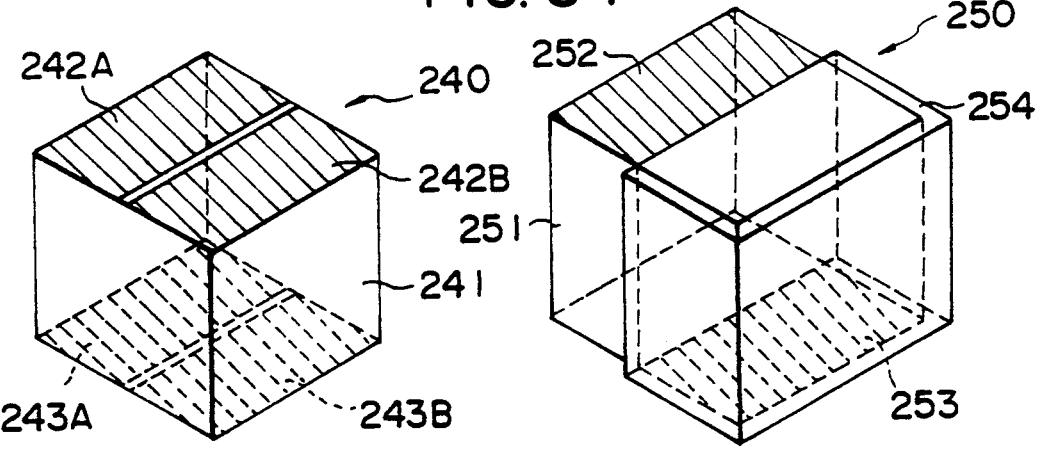
FIG. 65
FIG. 66

VIBRATOR-TYPE ACTUATOR

BACKGROUND OF THE INVENTION

The present invention relates to a piezoelectric vibrator and a vibrator-type actuator.

A vibrator-type actuator using a piezoelectric vibrator as an electromechanical conversion means for application to a miniaturized and high-torque producing apparatus in a precision mechanical equipment has been developed. Particularly, ultrasonic motors have been developed and put into practical use as vibrator-type actuators.

So far three types of ultrasonic motor systems have been developed. The first is the so-called "travelling-wave-type" or "mode rotation-type"; the second is the "standing wave-type", which is based upon the standing wave; and the third is the "multi resonance-type". The typical structures and operational principles of these motor systems are disclosed in papers: "Ultrasonic Motors Using Piezoelectric Multi-Mode Vibrators" by Takehiko Tanaka et al., Japanese Journal of Applied Physics, Vol. 27 (1988) Supplement 27-1, pp. 192-194, and "Construction of Ultrasonic Motors and their Applications" by Yoshiro Tomikawa et al., Japanese Journal of Applied Physics, Vol. 27 (1988) Supplement 27-1, pp. 195-197.

The above known ultrasonic motors are, however, complex in both mechanical and circuit structure with respect to the driving circuit for the piezoelectric vibrator. As a result these structures cause problems and difficulty in miniaturization and cost reduction.

In a prior U.S. application Ser. No. 07/357,733 by the same applicant, there are proposed a new structure and several apparatuses for applications of the vibrator-type actuator.

SUMMARY OF THE INVENTION

A primary object of the present invention is to provide a new structural vibrator and vibrator-type actuator for improving stability and output characteristics.

An object of the present invention is to provide a vibrator and a vibrator-type actuator which result in stable output characteristics, over a long time.

Another object of the present invention is to provide a vibrator and a vibrator-type actuator having a superior wear resistance characteristic.

Another object of the present invention is to provide a vibrator and a vibrator-type actuator with little variation in the resonance frequency.

A further object of the present invention is to provide a piezoelectric vibrator capable of causing a large vibration displacement with a relatively low alternative voltage applied thereto.

Still another object of the present invention is to provide a piezoelectric vibrator in which the magnitude and direction of the vibration displacement may be arbitrarily controlled.

According to one aspect of the present invention there is provided a piezoelectric vibrator comprising:

a pillar shaped piezoelectric body;

a pair of electrodes formed on both end surfaces of the piezoelectric body, the both end surfaces being essentially perpendicular to a polarization axis of the piezoelectric body; and a cover covering at least a part of a side surface of the piezoelectric body, the cover being made of a material having high wear resistant and large heat conductivity characteristics.

According to another aspect of the present invention, there is provided a vibrator-type actuator comprising:

a pillar shaped piezoelectric body;

a pair of electrodes formed on both end surfaces of the piezoelectric body, the both end surfaces being essentially perpendicular to a polarization axis of the piezoelectric body;

a cover covering at least a part of a side surface of the piezoelectric body, the cover being made of a material having high wear resistant and large heat conductive characteristics; and a moving element made to contact with the cover in the longitudinal direction of the piezoelectric body.

According to another aspect of the present invention, there is provided a vibrator-type actuator comprising:

a pillar shaped piezoelectric body;

a pair of electrodes formed on both end surfaces of the piezoelectric body, said both end surfaces being essentially perpendicular to a polarization axis of the piezoelectric body; and a cover covering at least a part of a side surface of the piezoelectric body, the cover being made of a material having high wear resistant and large heat conductivity characteristics, and the cover being secured to supporting means at a portion of the side surface of the cover where a small vibration displacement is caused.

According to another aspect of the present invention, there is provided a piezoelectric vibrator comprising:

a pillar shaped piezoelectric body polarized in an axial direction thereof and having two end surfaces essentially perpendicular to the axis thereof; and two electrodes each formed on a half part of each of the end surfaces, the two electrodes being symmetrically formed with respect to a center point of the piezoelectric body.

According to another aspect of the present invention, there is provided a piezoelectric vibrator comprising:

a rectangular pillar shaped piezoelectric body polarized in a longitudinal direction thereof; and electrodes each formed on a part of each end surface of the piezoelectric body, the electrodes on both end surfaces being formed at asymmetrical positions with respect to a plane essentially perpendicular to the longitudinal direction.

The present invention has a pair of electrodes formed on both end surfaces of a pillar-shape piezoelectric body polarized in a longitudinal or axial direction thereof. A cover is formed on at least a part of the side surface of the piezoelectric body. The cover is made of a material having high wear resistant and large heat conductivity characteristics. The electrode is formed on a part of the end surface. A moving element is pressed against the cover in the longitudinal direction of the piezoelectric body. The cover is secured to supporting means at a portion of the side surface of the cover where a small vibration displacement is caused. Each of the paired electrodes are formed at essentially symmetrical portions with respect to a center point of the piezoelectric body or at asymmetrical portions with respect to a plane perpendicular to the longitudinal direction.

Other objects and features of the present invention will be clarified from the following description with reference to the attached drawings.

BRIEF DESCRIPTION OF THE DRAWINGS

FIG. 1 is a perspective view of a vibrator-type actuator;

FIGS. 2A-2C are a left side view, a front view and a right side view of the actuator in FIG. 1;

FIG. 8 is a table of the calculated and experimental values of the coupled resonance frequency of the cylindrical vibrator;

FIG. 64 represents the revolution and the applied alternating voltage of the vibrator-type actuators in which the piezoelectric vibrators of FIGS. 49, 62 and 63 are used; and FIGS. 65 and 66 are perspective views of piezoelectric vibrators of the invention.

DETAILED DESCRIPTION OF THE INVENTION

Figures 10, 11:
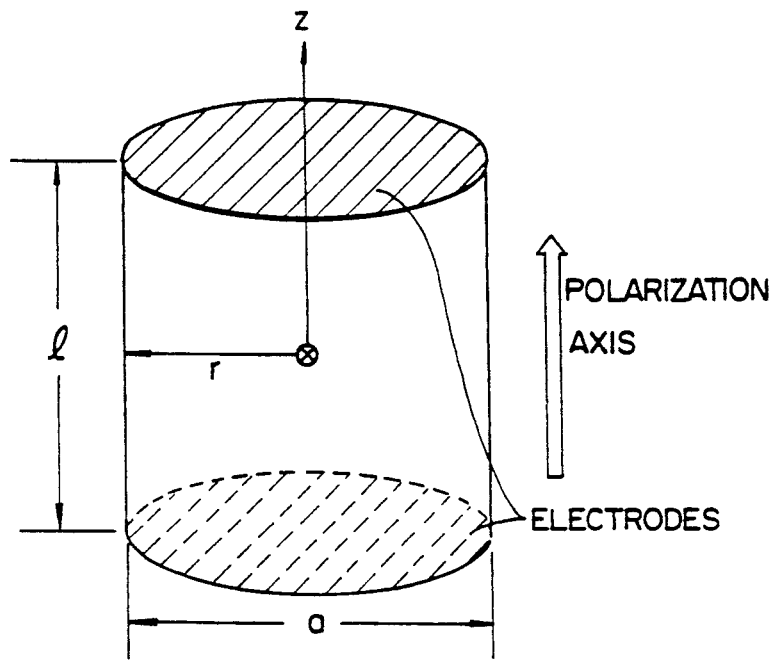
FIG. 10 represents coordinates of the cylindrical vibrator.
FIG. 11 is a table representing various kinds of constants of the vibrators used in an experiment.

The vibration of a cylindrical vibrator is assumed to be two-dimensional coupling of the longitudinal vibration and the radial vibration. Coordinates of the cylinder are shown in FIG. 10. The resonance angular frequency $\omega_l$ in the longitudinal direction is expressed by:

$$\omega_l^2 = \frac{\pi^2 E}{l^2 \rho} \tag{1}$$

where $l$ is a length of the cylindrical vibrator; $\rho$, the density; and E, Young's modulus.

The resonance angular frequency $\omega_r$ in the radial direction is given by:

$$\omega_r^2 = \frac{\zeta^2}{r^2(1-\sigma^2)} \cdot \frac{E}{\rho} \tag{2}$$

where r represents the radius of the cylindrical vibrator; $\sigma$, a Poison's ratio; and $\zeta$, a root of the following Bessel function.

$$\zeta J_0(\zeta) - (1-\sigma) J_1(\zeta) = 0 \tag{3}$$

In general, the resonance angular frequency of the isotropic vibrator is provided by the following formula;

$$\begin{aligned}
\omega^6 &= (1 - 3\mu^2 - 2\mu^3) - \\
&\quad \omega^4(1-\mu^2)(\omega_a^2 + \omega_b^2 + \omega_c^2) + \\
&\quad \omega^2(\omega_a^2\omega_b^2 + \omega_b^2\omega_c^2 + \omega_c^2\omega_a^2) - \omega_a^2\omega_b^2\omega_c^2 \\
&= 0
\end{aligned} \tag{4}$$

A basic Equation of the three-dimensional coupling vibration of the cylindrical vibrator is obtained using the relations.

$$\begin{aligned}
\omega_a &= \omega_l \\
\omega_b &= \omega_r \\
\omega_c &= \omega_r
\end{aligned} \tag{5}$$

$$\left\{ \omega^2 - \frac{1-\sigma}{1+\sigma} \omega_r^2 \right\} \left\{ \omega^4 \frac{(1+\sigma)(1-\sigma)}{1-\sigma} - \right.$$
$$\left. \omega^2(\omega_l^2 + \omega_r^2) + \omega_l^2 + \omega_r^2 \right\} = 0 \tag{6}$$

Using the following relation $$1 - \eta^2 = \frac{(1+\mu)(1-2\mu)}{1-\mu}$$

the second term of the equation (6) is represented as:

$$\omega^4(1-\eta^2) - \omega^2(\omega_l^2 + \omega_r^2) + \omega_l^2 + \omega_r^2 = 0 \tag{7}$$

which obviously coincides with the two-dimensional coupling equation of $\omega_l$ and $\omega_r$ having the coupling coefficient $\eta$. When the piezoelectric ceramic polarized in the longitudinal direction is driven, the vibration derived from the first term:

$$\omega^2 = \frac{1-\sigma}{1+\sigma} \omega_r^2 \tag{8}$$

is not observed.

From Equation (7) two coupled mode frequencies $\omega_1$ and $\omega_2$ may be expressed as:

$$\omega_1^2 = \frac{\pi E}{l^2 \rho} \cdot \frac{p^2 + 1 - \sqrt{(p^2+1)^2 - 4p^2(1-\mu^2)}}{2(1-\mu^2)} \tag{9}$$

$$\omega_2^2 = \frac{\pi E}{l^2 \rho} \cdot \frac{p^2 + 1 + \sqrt{(p^2+1)^2 - 4p^2(1-\mu^2)}}{2(1-\mu^2)} \tag{10}$$

where $$p = \frac{\zeta}{\pi \sqrt{1-\sigma^2}} \cdot \frac{l}{r} \tag{11}$$

When $p \gg 1$ or $R \gg l_1$, $\omega_1$, is substantially equal to Equation (2) and $\omega_2$ is expressed by:

$$\omega_2^2 = \frac{\pi^2 E}{\rho} \cdot \frac{1}{1-\eta^2} \tag{12}$$

This indicates the thickness mode vibration of the thin disk (circular plate) which may be obtained.

On the other hand, when $p \ll 1$ or $r \ll 1$, from Equation 9, $\omega_1$, coincides with Equation (1) and $\omega_2$ is expressed by:

$$\omega_2^2 = \frac{\zeta^2}{r^2(1-\sigma^2)(1-\eta^2)} \cdot \frac{E}{\rho} \tag{13}$$

This corresponds to an expansional vibration in a radial direction of a cylinder having infinite longitudinal length.

FIG. 8 shown the experimental and theoretical first and second resonance frequencies f1 and f2 obtained by Equations (9) and (10) with different materials and different shape parameters. As the materials, models TDK 71B and TDK 91C (71B and 91C are piezoelectric ceramics produced by TDK of Japan) were used. A diameter and a longitudinal length were used as the shape parameters. For example, in FIG. 8, D10-L7.31 indicates that the diameter and longitudinal length are 10 mm and 7.31 mm, respectively. As seen from FIG. 8, the experimental and theoretical results on the coupling resonance frequencies of the cylindrical vibrator are almost in agreement. The error therebetween is due to the difference of electromechanical coupling coefficients.

Figure 9:
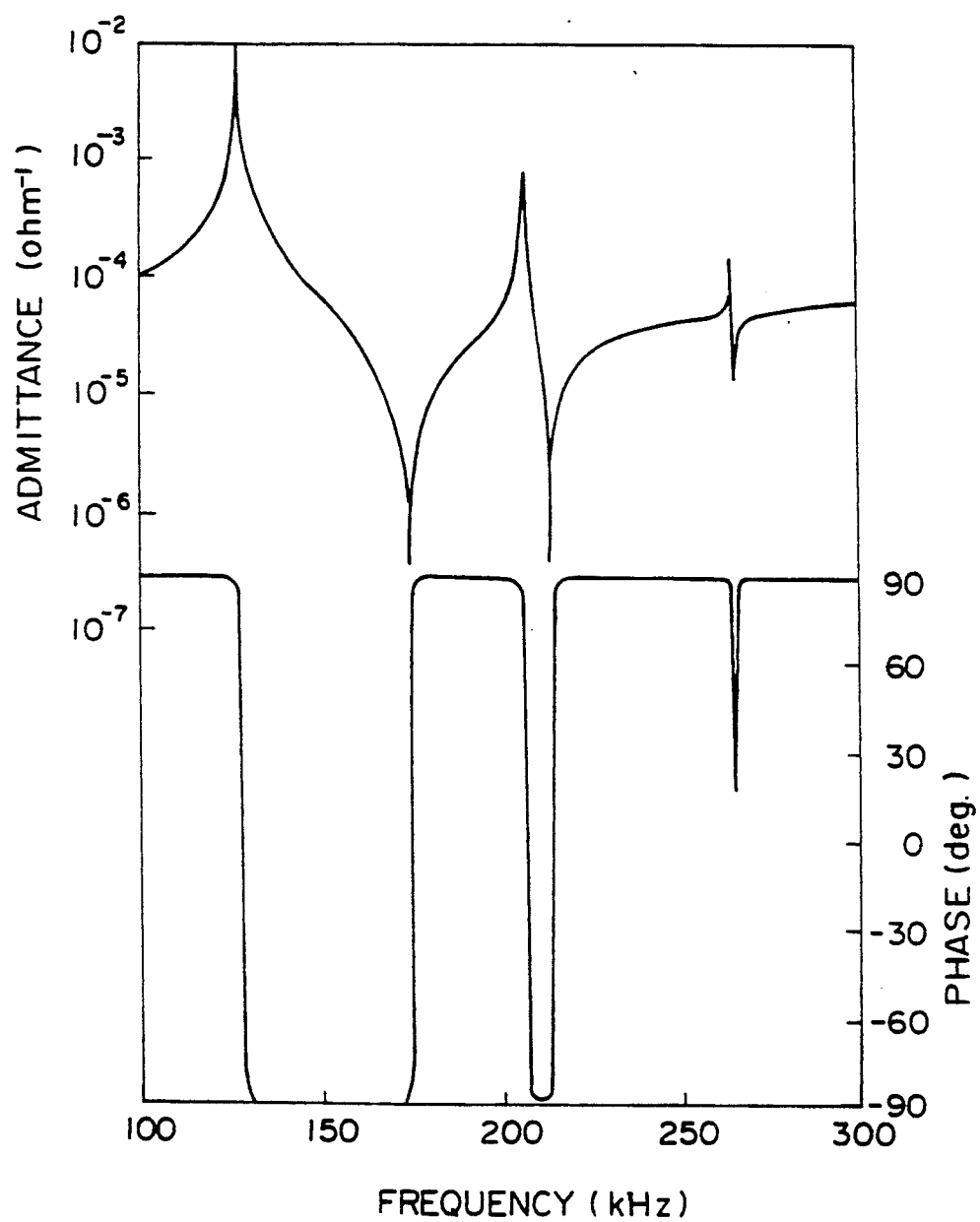
FIG. 9 represents frequency characteristics of magnitude and phase of the free admittance of the cylindrical vibrator.

FIG. 9 shows frequency characteristics of the magnitude and phase of the admittance of the cylindrical vibrator (FM-71B material). The resonance frequencies shown therein correspond to the first and second resonance frequencies given in FIG. 8. The first resonance vibration corresponds to the vibration in which the axial and radial vibrations have a reversed-phase relationship to each other (reversed-phase mode coupling vibration). The second resonance vibration corresponds to the vibration in which the axial and radial vibrations have a cophase relationship with each other (cophase mode coupling vibration). In the reversed-phase mode, two orthogonal vibrations are driven with $\pi/2$ phase difference, forming elliptical motion on the side surface of the vibrator. Although the elliptical motion is formed by the cophase mode vibration, a small elliptical motion may be caused due to the smaller amplitude vibration compared with the first resonance.

Now, the displacements $U_z$, and $U_r$, at an arbitrarily selected mass point in the z and r directions are respectively represented as:

$$U_z = U_{zo} \cdot \cos \omega t \quad (14)$$

$$U_r = U_{ro} \cdot \cos(\omega t - \phi) \quad (15)$$

The displacement amplitude on the cylindrical vibrator are expressed by:

$$U_{zo} = A \cdot \sin(k_z Z) \quad (16)$$

$$U_{ro} = B \cdot \frac{J_1(k_r \cdot r)}{J_1(k_r \cdot a)} \quad (17)$$

where
- a: diameter of the cylindrical vibrator
- z: longitudinal length in the axial direction
- r: length in the radial direction
- A: axial displacement at $z = \pm \frac{l}{2}$, $r = 0$
- B: radial displacement at $z = 0$, $r = a/2$
- $k_r$, $K_z$: wave constants
- J1: Bessel function of the first order
- $\omega$: angular frequency
- $\phi$: phase difference between the vibration displacements in the z and r directions When the vibration is caused under the reversed-phase mode, that is, $\phi = \pi/2$, the locus of the mass point is expressed by:

$$\frac{U_z^2}{U_{zo}^2} + \frac{U_r^2}{U_{ro}^2} = 1 \quad (18)$$

indicating elliptical motion. Although in this case $\phi$ is set at $\pi/2$, the elliptical motion of the mass point may be obtained for an arbitrarily selected $\phi$.

The coupling degree of two vibration components on the cylindrical vibrator is determined by parameters such as its dimensional ratio and material constants. The vibration displacement is also dependent upon those parameters. In order to clarify the relationship of the displacement distribution with the dimensional ratio and the material constants, an experiment for measuring the mechanical displacement distribution on the respective side surfaces has been performed by using vibrators of different dimensional ratios and material constants. In the experiment, a bearing having a diameter of 19 mm and a width of 5 mm is pressed against the side surface of the vibrator. Against the displacement direction and the displacement amplitude, the rotation direction and the revolutions of the bearing have been measured. In FIG. 11, the material constants of the vibrator employed for the experiment are given. The shape of the vibrator used is 10 mm in diameter and length, and it is polarized in the axial direction. The following description will be done for the vibration mode of the first resonance.

Figure 12:
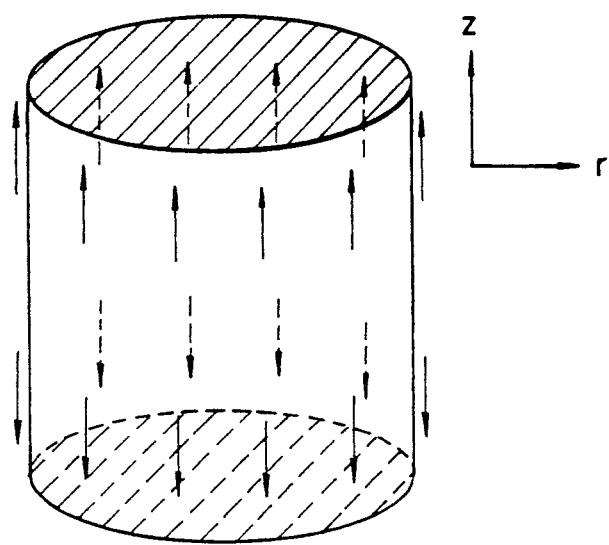
FIG. 12 represents a displacement distribution characteristic on the surface of the cylindrical vibrator.
Figure 13:
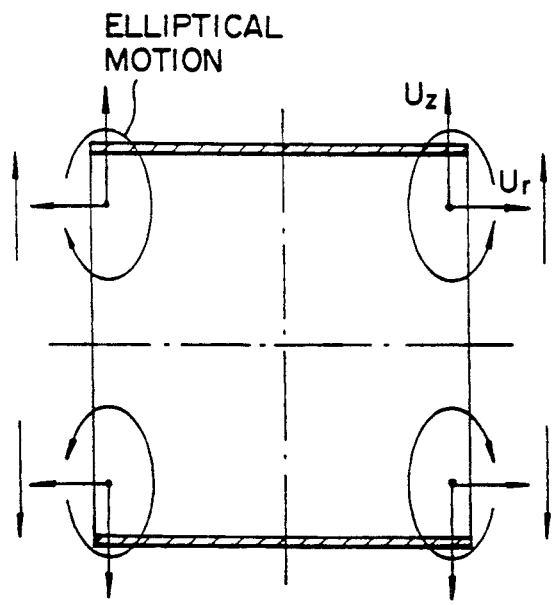
FIG. 13 is a mode diagram of the elliptical motion displacement.

FIG. 12 shows the displacement distribution characteristic on the surface of the cylindrical vibrator. An arrow direction indicates a rotating direction of the bearing and an arrow length indicates a rotating strength. Due to the symmetry of the electrode shape the displacement in the axial direction shows symmetrical distribution with respect to a plane of $z = 0$. The same displacement distributions were observed for the four kinds of vibrators. FIG. 13 is a mode diagram of the elliptical motion displacement representing the concept of forming the elliptical motion displacement. It will be clearly understandable that FIG. 13 is in agreement with the observed result of FIG. 12.

Figure 14:
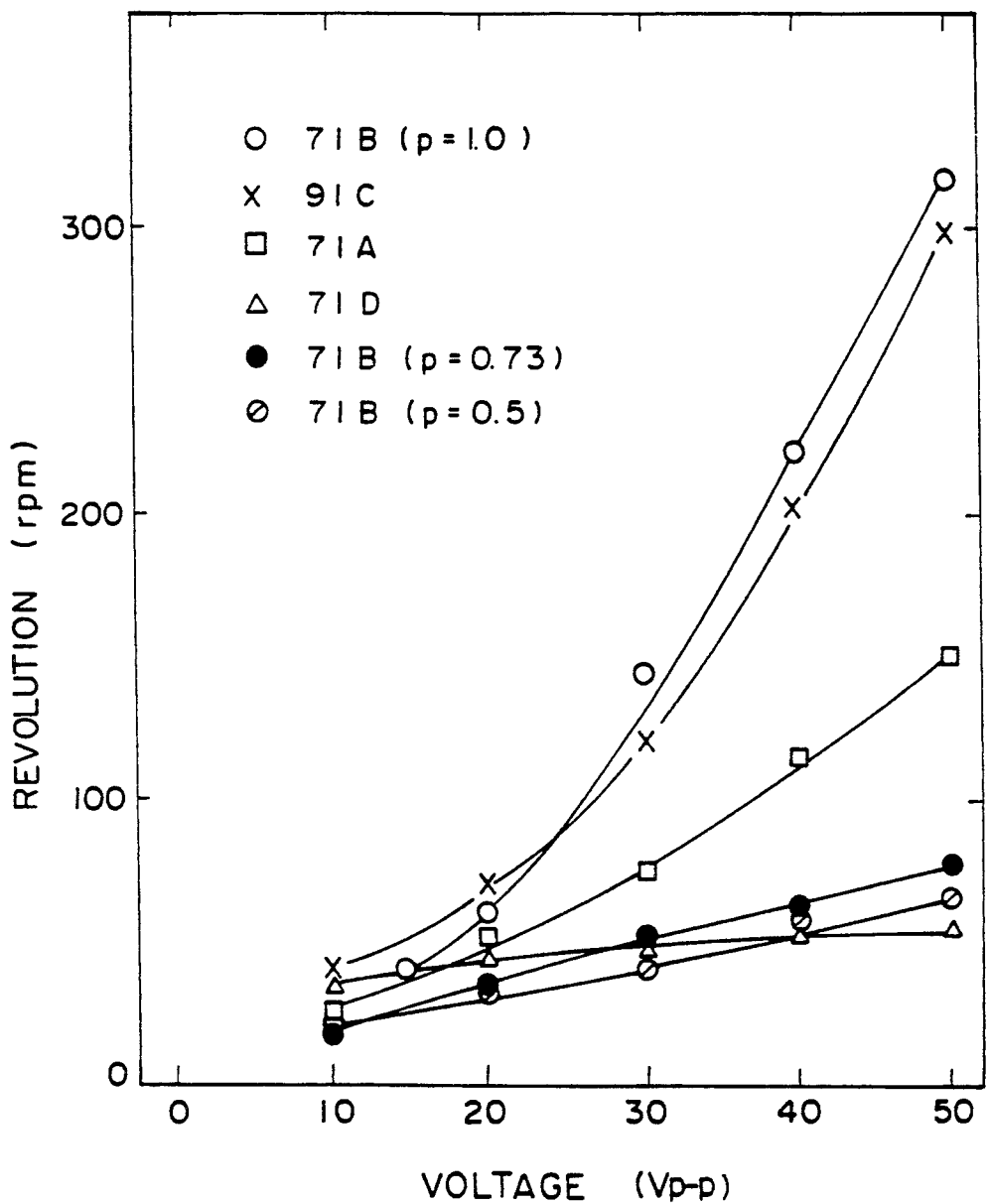
FIG. 14 represents a relationship between the applied voltage and the revolution of the bearing.

In FIG. 14, there is shown a relationship between a voltage applied to the vibrator and revolution of the bearing pressed against the side surface of the vibrator. From FIG. 14, it is seen that the revolution is larger for the vibrators made of 71B and 91C materials having the large electromechanical coupling coefficients $k_{33}$ and piezoelectric constants $d_{33}$, while the revolution is smaller for the vibrators made of 71A and 71D materials having the small coefficients and constants. This may result from the difference of the ellastical coupling degree between the lateral vibration and the radial vibration.

Having measured the displacement distribution of the 71B material which gives the largest revolutions for a dimensional ratio $p = 1$ (p = length/diameter), for p of 0.73 and 0.5, it has been found that the displacement distribution is symmetrical with respect to the plane of $z = 0$ and the revolution is smaller than that for $p = 1$ with the same input. From the above result, the vibrator having a large electromechanical coupling coefficient $k_{33}$, a large piezoelectric constant $d_{33}$ and a dimensional ratio of 1 should be selected to obtain effective elliptical motion displacement.

The present invention realizes an unidirectional elliptical vibration displacement on the side surface. In the present invention at least one of the electrodes formed on the end surfaces of the pillar-shaped piezoelectric body is separated into two portions and an alternating signal is exchangeably applied to the separated two electrodes, thereby changing the direction of the vibration displacement. Furthermore, at least one of the electrodes formed on the end surfaces is partially removed to introduce an asymmetrical element, causing asymmetrical radial vibration with respect to the axis. As described above, the direction of the elliptical vibration displacement is determined by the phase relationship between the lateral vibration and the radial vibration.

Referring to FIG. 1 and FIGS. 2A–2C, one end surface the piezoelectric body 1a constituting a vibrator 11 is separated into two electrodes, $1b_A$ and $1b_B$ and the electrode to which the alternating signal is to be applied is selected, thereby controlling the phase of the radial vibration. Here, it is to be noted that another electrode 1c is formed on the other entire end surface.

Figure 3:
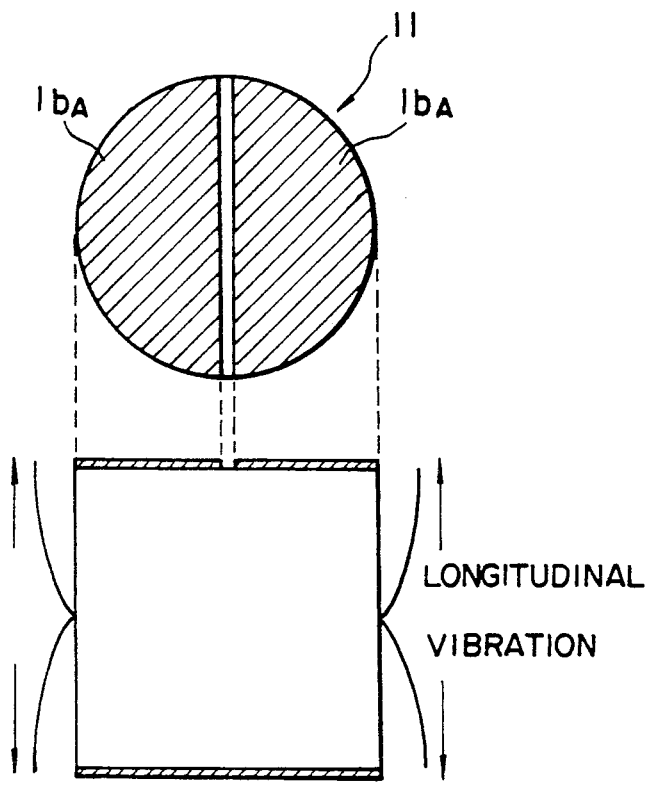
FIG. 3 is a diagram representing a longitudinal vibration and an asymmetrical vibration with respect to the axis.

FIG. 3 represents vibration modes of the asymmetrical coupling vibration with respect to the axis. The radial vibrations are caused, as shown by the dotted line and the solid line, when the alternating signal is applied to electrodes $1b_A$ and $1b_B$, respectively. By exchanging the electrode to which the signal is to be applied, the phase of the radial vibration may be shifted by $\pi$ so that the direction of the elliptical vibration displacement may be changed.

Figure 4:
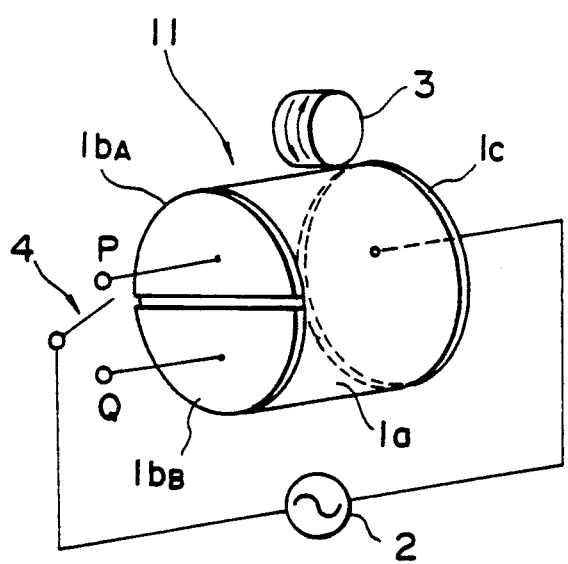
FIG. 4 is a schematical view of an ultrasonic motor using the vibrator shown in FIG. 1.

Referring to FIG. 4, a rotor 3 is made to contact with a portion of piezoelectric body 1a, where a large vibration displacement is caused, on the cylindrical side surface of the piezoelectric body 1a. The rotor 3 is pressed against the portion of piezoelectric body 1a by any pressing means such as a spring (not shown). The output signal from the alternating power source 2 is applied to terminal P or Q via a switch 4 for controlling the rotation direction of the rotor 3. According to the embodiment shown in FIG. 4, a simplified actuator employing a single-phase alternating power source 2 and switch 4 may be used.

Figure 5:
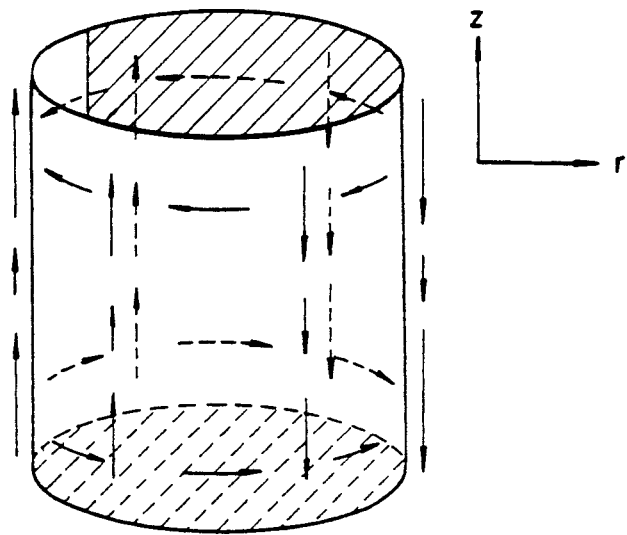
FIG. 5 represents a displacement distribution on the vibrator surface of another type of vibrator.

FIG. 5 schematically shows displacement distribution characteristics on side surfaces of the vibrator in which the electrode is removed in part, or the electrode is formed on a part of the end surface. It is seen that the displacement in the circumferential direction is small on the portion where the displacement in the axial direction is large, while the displacement in the axial direction is small on the portion where the displacement in the circumferential direction is large, resulting in an asymmetrical displacement distribution with respect to the central axis. The displacement in the axial direction on the same side surface has unidirectionality. There exists a side surface portion where a small displacement in the axial direction is caused. Consequently, this side surface portion may be fixedly supported by any means without any problem, making it easier to support the vibrator.

Figure 7:
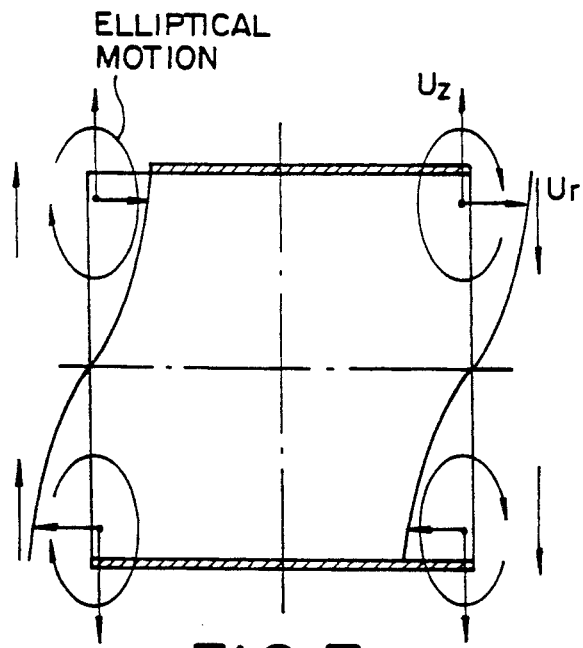
FIG. 7 is a mode diagram of the elliptical motion displacement of the vibrator in FIG. 5.
Figure 6:
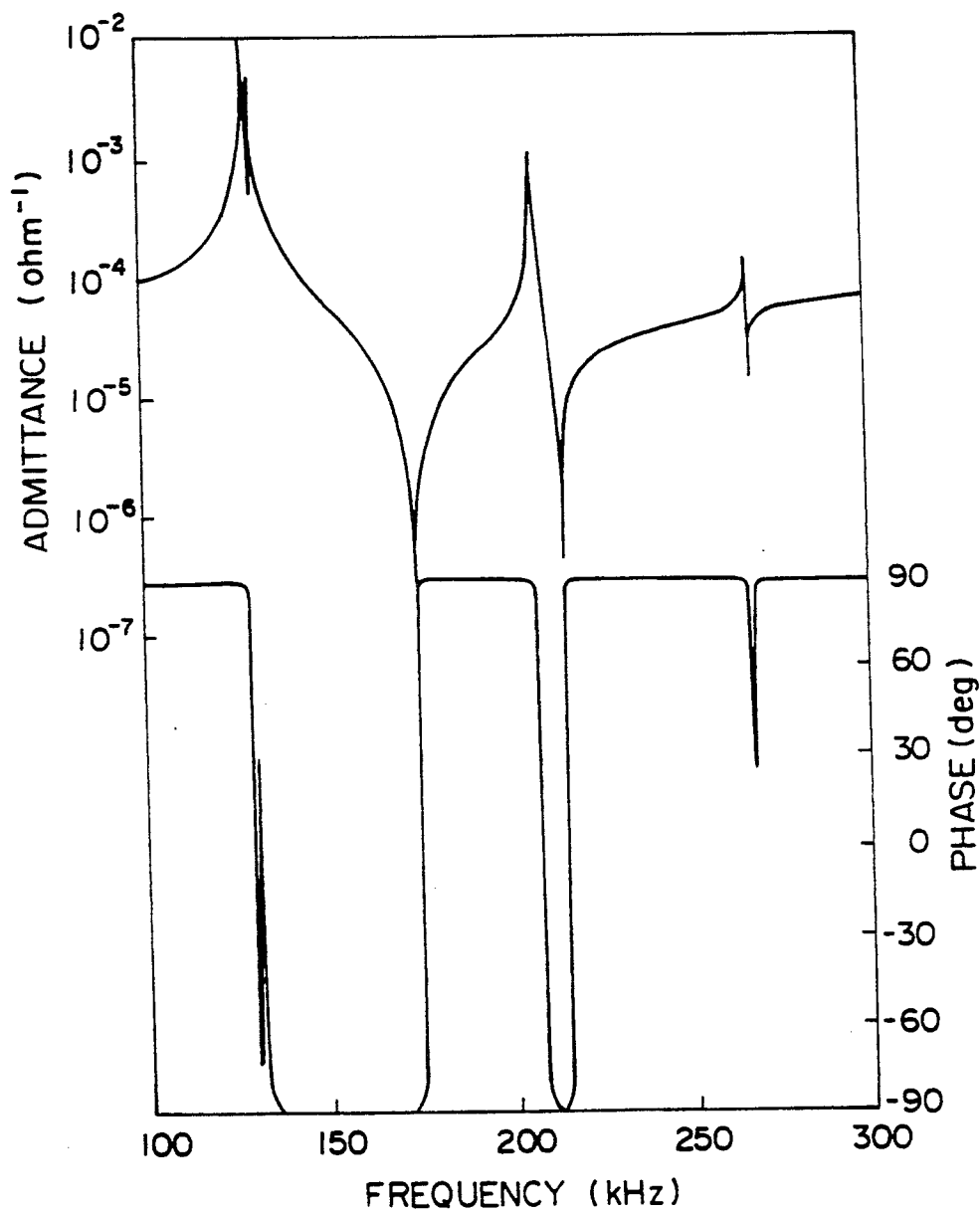
FIG. 6 represents frequency characteristics of magnitude and phase of the free admittance of the vibrator in FIG. 5.

In FIG. 6 there is shown frequency characteristics of the magnitude and phase of the free admittance of the vibrator. It is understandable from the displayed characteristics, that the first resonance frequency is split due to the partial removal of the electrode. The observed result coincides to the mode diagram of the elliptical vibration displacement shown in FIG. 7.

In the above vibrator-type actuator the rotating element is pressed against the side surface of the piezoelectric body. Thus, the contact portion of the piezoelectric body with the rotating element is subject to wear by the rotating element and the shaved waste of the piezoelectric body may get between the rotation element and the piezoelectric body. This prevents the movement of the rotating element and causes variation of the revolution thereof.

Due to heat caused in the piezoelectric body by lengthy driving of the piezoelectric body and by friction with the rotating element, the resonance frequency of the piezoelectric body is reduced and the revolution of the rotating element varies. Consequently, it is very difficult to obtain a stable vibrator-type actuator over a long time.

Figure 15:
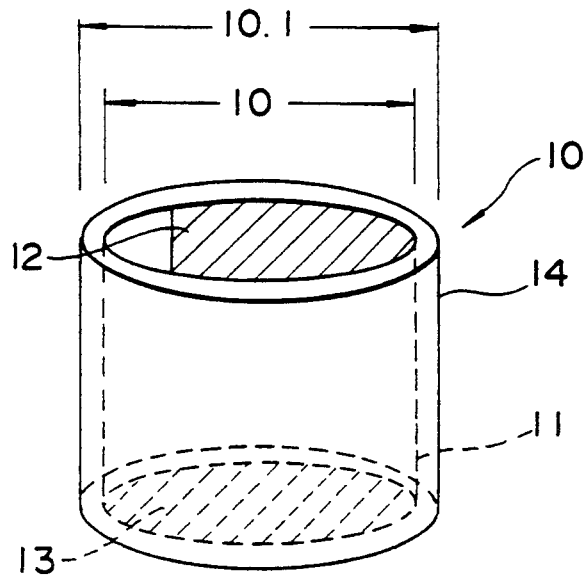
FIG. 15 represents one embodiment of the present invention.

An embodiment of the present invention resides in an improvement in stability of the vibrator-type actuator. FIG. 15 shows a perspective view of an embodiment of the present invention.

A piezoelectric vibrator 10 includes a pillar-shape piezoelectric body 11. In this embodiment, the piezoelectric body 11 has a cylindrical shape and is polarized in the axial direction. Both end surfaces of the piezoelectric body 11 are essentially perpendicular to the axis thereof. On one of the end surfaces of the piezoelectric body 11 a partially removed electrode 12 is formed, while on the other end surface an electrode 13 covering the whole surface is formed. The diameter and length of piezoelectric body 11 are 10 mm, for example. A cover 14 is formed on the outer circumference surface of piezoelectric body 11 and is made of phosphorus bronze and is 0.05 mm in thickness.

Figure 16:
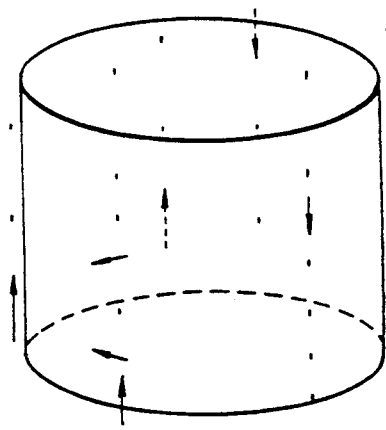
FIG. 16 is a diagram of the displacement distribution on the cover surface of the piezoelectric vibrator of FIG. 15.

FIG. 16 indicates the displacement distribution on the surface of the cover 14. The alternating signal having a frequency equal to the resonance frequency of the piezoelectric vibrator 10 is applied to the piezoelectric vibrator 10 through electrodes 12, 13. The piezoelectric vibrator 10 is driven with a frequency lower than the resonance frequency of the piezoelectric body 11. The vibration displacement caused on the outer circumferencial surface of the piezoelectric body 11 is transmitted to the cover 14 and a unidirectional vibration displacement is caused on the outer circumferencial surface of the cover 14. In FIG. 16, the direction and length of the arrows represent the direction and strength of the vibration displacement, respectively. The piezoelectric body 11 generates heat after a long time application of the alternating signal. The heat conductivity of the cover 14 is much larger than that of the piezoelectric body 11 so that the heat generated from the piezoelectric body 11 is effectively radiated through the cover 14. As a result, the temperature rise of the piezoelectric body 11 and the resonance frequency variation of the piezoelectric vibrator 10 due to the temperature rise may be suppressed.

Figure 17:
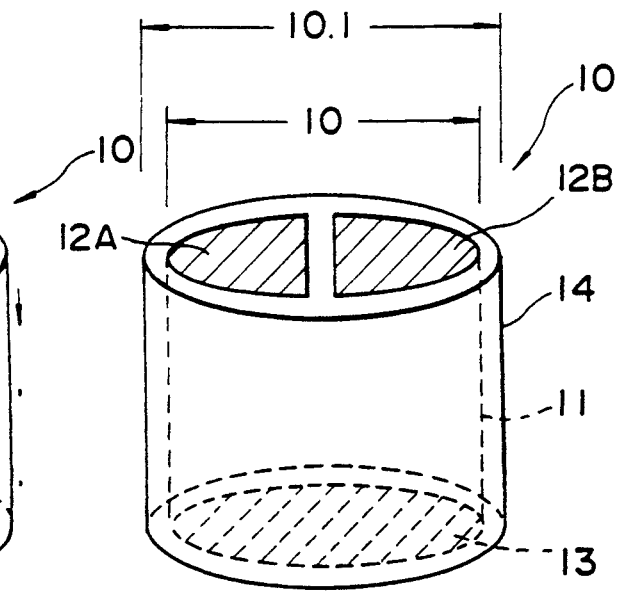
FIG. 17 is a perspective view of another embodiment of the invention.

In another piezoelectric body 10 shown in FIG. 17, a pair of electrodes 12A, 12B are formed on one end surface of the piezoelectric body 11 and an electrode 13 is formed on the other end surface. Thus, the direction of the vibration displacement on the surface of the cover 14 of the vibrator 10 may be changed by changing the application of the alternating signal to electrode 12A or 12B.

Figure 18:
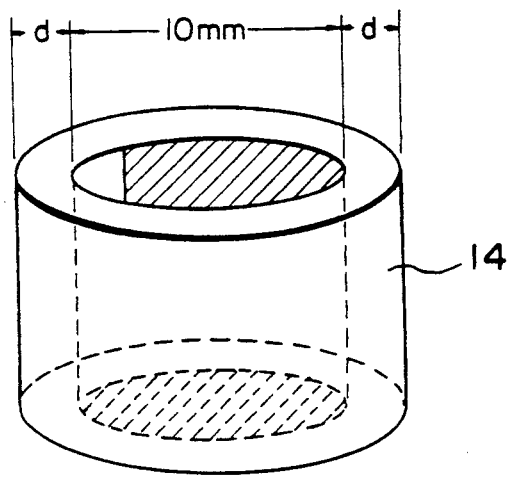
FIG. 18 is a perspective view of another embodiment of the invention.

Other embodiments are shown in FIGS. 18 to 23. As shown in FIG. 18, a partially removed electrode is formed on one end surface of the piezoelectric body in a similar way to that shown in FIG. 15. In other words, an electrode is formed on a part of one end surface. The diameter and length of the piezoelectric body are 10 mm. The thickness of a cover 14 is represented by d(mm).

Figure 19:
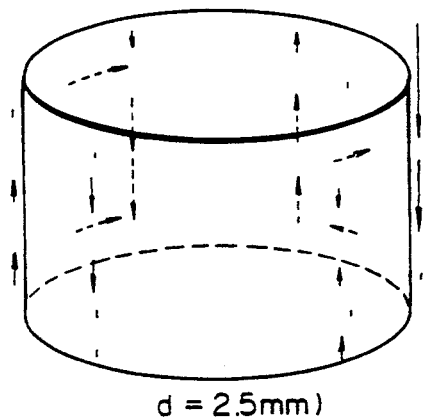
FIGS. 19, 20 and 21 represent vibration displacement distributions of a piezoelectric vibrator with a cover of 2.5 mm, 5 mm and 10 mm in thickness.
Figure 20:
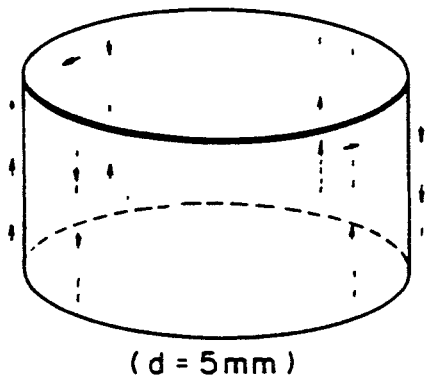
Figure 21:
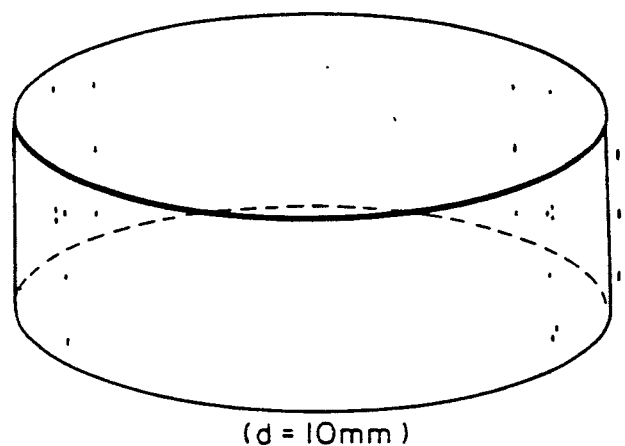

FIGS. 19 to 21 show the displacements on the side surface of the cover 14 for d=2.5 mm, 5 mm and 10 mm. As is seen from the drawings, the thicker d becomes, the smaller the vibration displacement becomes.

Figure 22:
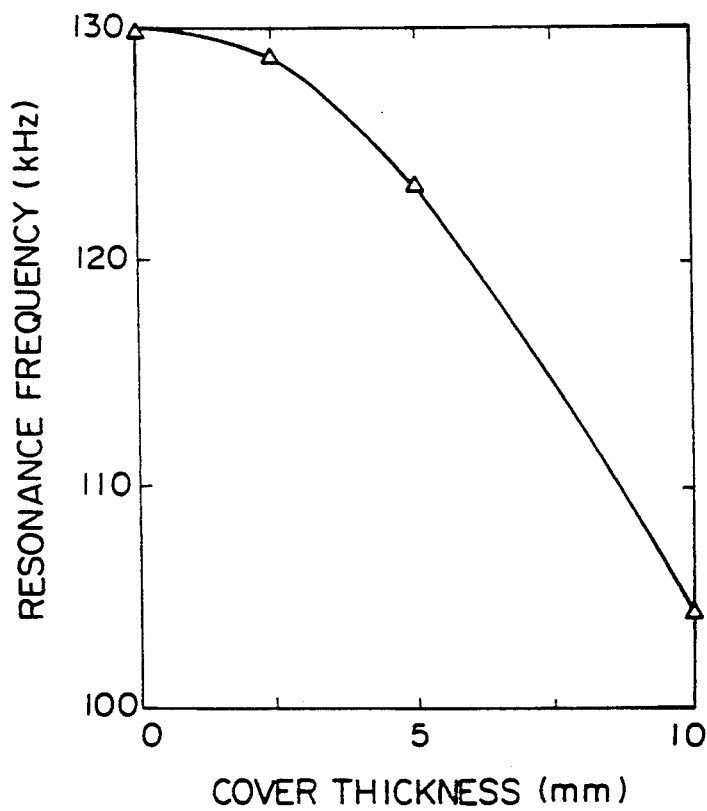
FIG. 22 is a diagram of the change of the resonance frequency with the cover thickness.
Figure 23:
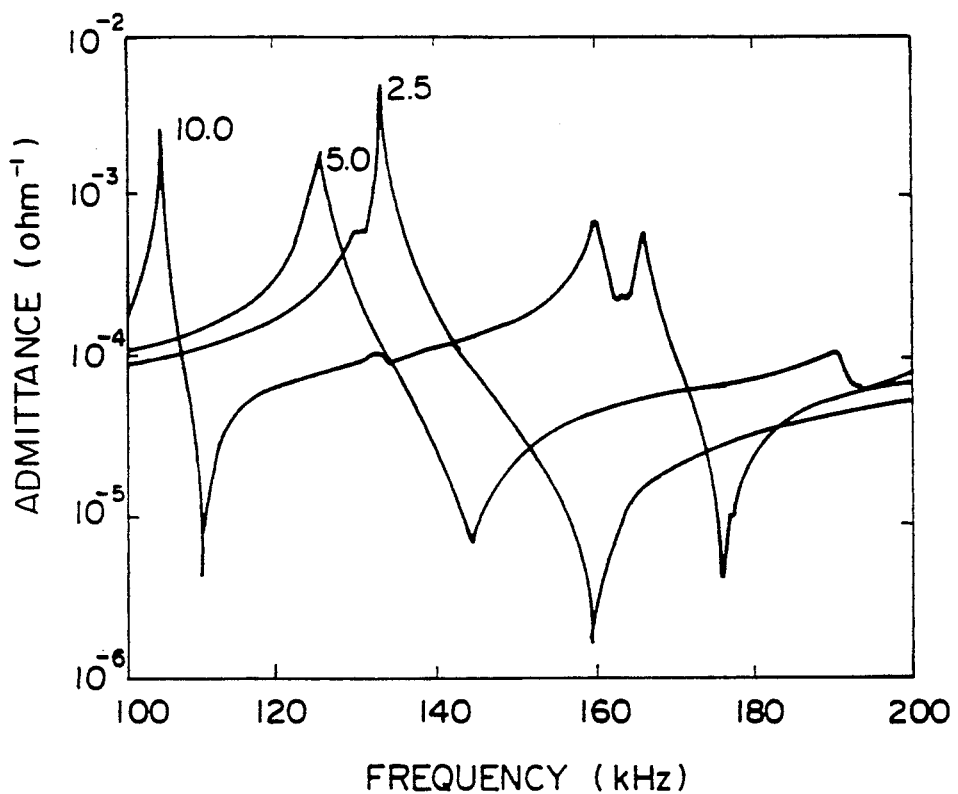
FIG. 23 is a diagram of the change of the free admittance with the cover thickness of the piezoelectric vibrator.

FIGS. 22 and 23 show the relationships between the thickness d and the resonance frequency, and between the frequency and the free admittance with the parameter d. It is apparent that the resonance frequency of the piezoelectric vibrator decreases with increase in thickness of the cover 14.

Figure 24:
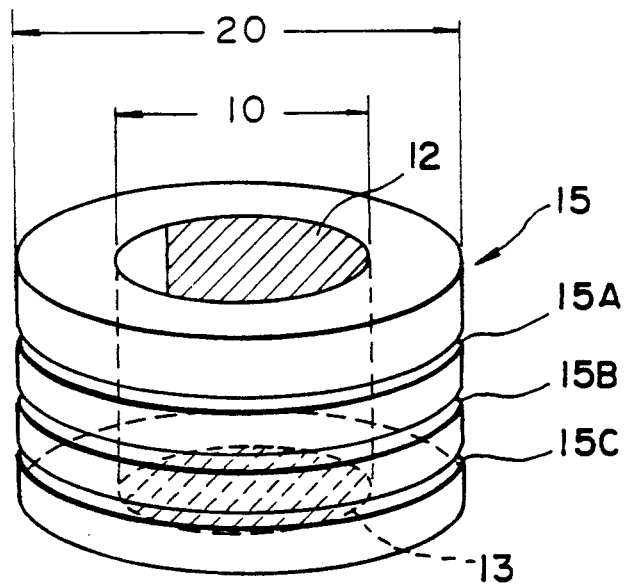
FIG. 24 represents another embodiment of the piezoelectric vibrator according to the invention.
Figure 25:
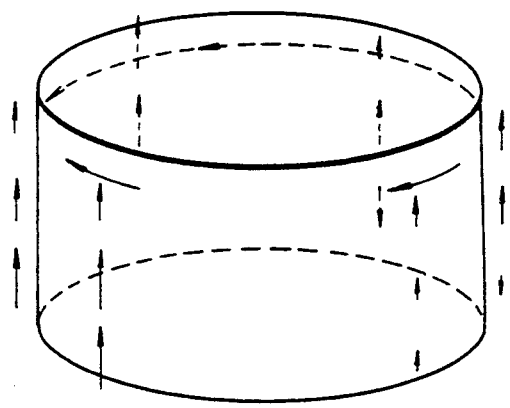
FIG. 25 represents a vibration displacement distribution of the piezoelectric vibrator in FIG. 24.

As shown in FIG. 24, a piezoelectric vibrator comprises a piezoelectric body on end surfaces of which electrodes 12, 13 are formed and a cover 15 covering the outer circumference surface of the piezoelectric body. The cover 15 is made of aluminum material and is 5 mm in thickness. A plurality of grooves 15A, 15B, 15C are formed on the surface of the cover 15 in the circumferential direction, thereby increasing the frictional coefficients of the surface of the cover 15. This makes it possible to effectively convert the vibration distribution on the piezoelectric body into the rotation movement of the rotating element. In the embodiment, three grooves are formed with the same interval therebetween. The vibration distribution of the piezoelectric body is obtainable as shown in FIG. 25.

Figure 26:
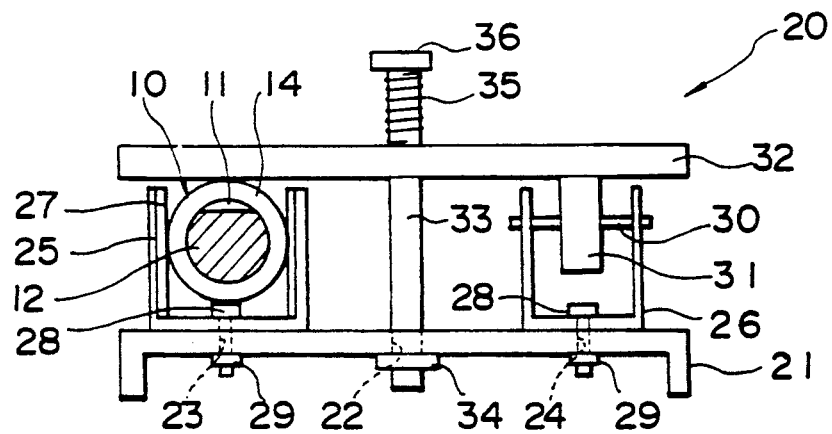
FIG. 26 represents a vibrator-type actuator according to the invention.
Figure 27:
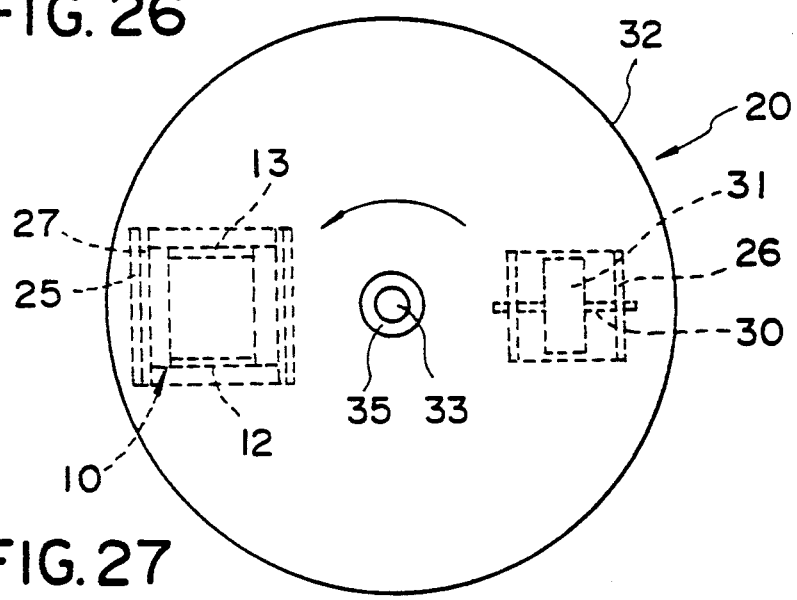
FIG. 27 is a side view of the vibrator-type actuator in FIG. 26.

FIGS. 26 and 27 show an application example of the present invention to an ultrasonic motor. A vibrator-type actuator 20 includes a support member 21 having a disk plate portion and ring-like legs extending along the edge under the disk plate portion. An opening 22 is formed in the center of the disk plate portion. An opening 24 is also formed on an opposed portion to an opening 23.

Channel members 25 and 26 are secured on the upper surface of the disk plate portion of the support member 21 by a bolt 28 and a nut 29. Rubber members 27 are formed on the opposed surfaces of the channel member 25. The channel members 26 are also secured on the disk plate portion of the support plate 21 in similar way to the channel member 25. The piezoelectric vibrator 10 having the partially removed (cutout) electrode is disposed within the channel member 25 such that the axis of the piezoelectric vibrator 10 is parallel to the disk plate portion and the partially removed portion of the electrode 12 is positioned at an upper side. The outer circumferential surface of the cover 14 of the piezoelectric vibrator 10 is pressed against the rubber member 27. Equipped to the channel member 26 is an axis 30 extending toward the center of the disk plate portion of the support member 21 parallel to the disk plate portion. A bearing 31, 13 mm in diameter, is supported by the axis 30. A rotating element 32 is pressed against the outer circumferential surfaces of the cover 14 and the bearing 31. The rotating element 32 may be made from a steel disk plate and has approximately the same diameter as that of the support member 21. The rotating element 32 is rotatably supported around the axis 33. The axis 33 extends vertically and is passed through the opening 22 of the disk plate portion. At one end of the axis 33 there is provided a brim 34 made to contact with the lower surface of the disk plate portion. At the other end of the axis 33 a screw (not shown) which is formed mates with a nut 36. A spring member 35 is disposed between the rotating element 32 and the nut 36. The pressure strength against the rotating element 32 by the spring member 35 determines the contact pressure between the rotating element 32 and the piezoelectric vibrator 10.

When the alternating signal (Vp−p=120 V) having the same frequency as the resonance frequency of piezoelectric vibrator 10 is applied, the piezoelectric vibrator 10 is driven to cause the vibration displacement on the outer surface of the cover 14. The vibration displacement on the contact surface of the cover 14 with the rotating element 32 is caused in the axial direction toward the electrode 12. The rotating element 32 is pressed against the outer surface of the cover 14 and rotated in the arrow direction of FIG. 27 through the vibration displacement on the contact portion of the rotation element 32 with the cover 14. The cover 14 is made of phosphorus bronze and has a high wear resistant characteristic, reducing any potential revolution variation of the rotating element 32 due to shaved waste.

Figure 28:
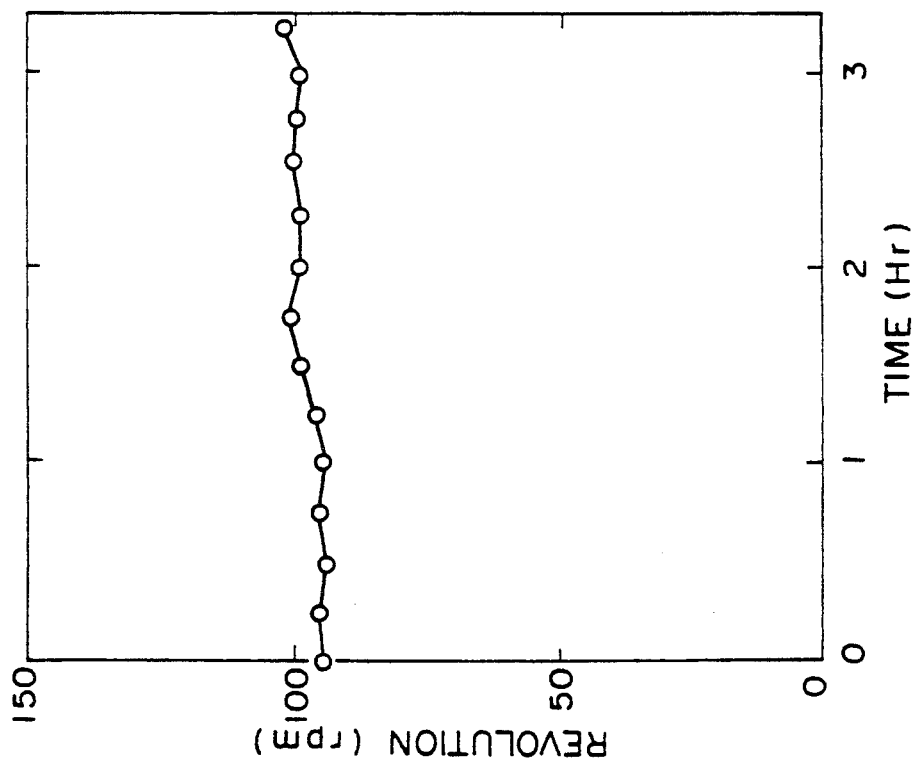
FIG. 28 represents a revolution change with time of the vibrator-type actuator in FIG. 26.

Furthermore, since the heat from the piezoelectric vibrator 10 is effectively radiated through the cover 14, the temperature rise of the piezoelectric vibrator 10 is also suppressed, thereby reducing the variation (fluctuation) of the driving frequency due to the characteristic variation over time of the piezoelectric vibrator 10. From the experimental result shown in FIG. 28 the revolution variation of the vibrator-type actuator 20 is negligible. That is, the difference between the maximum and minimum revolutions of the bearing 31 is 7 (rpm) and the averaged revolution is 97.6 (rpm). The variation range is ±3 (rpm), that is, variation rate of the revolution of the bearing 31 corresponding to the vibrator-type actuator 20 is ±3.6%.

Figure 29:
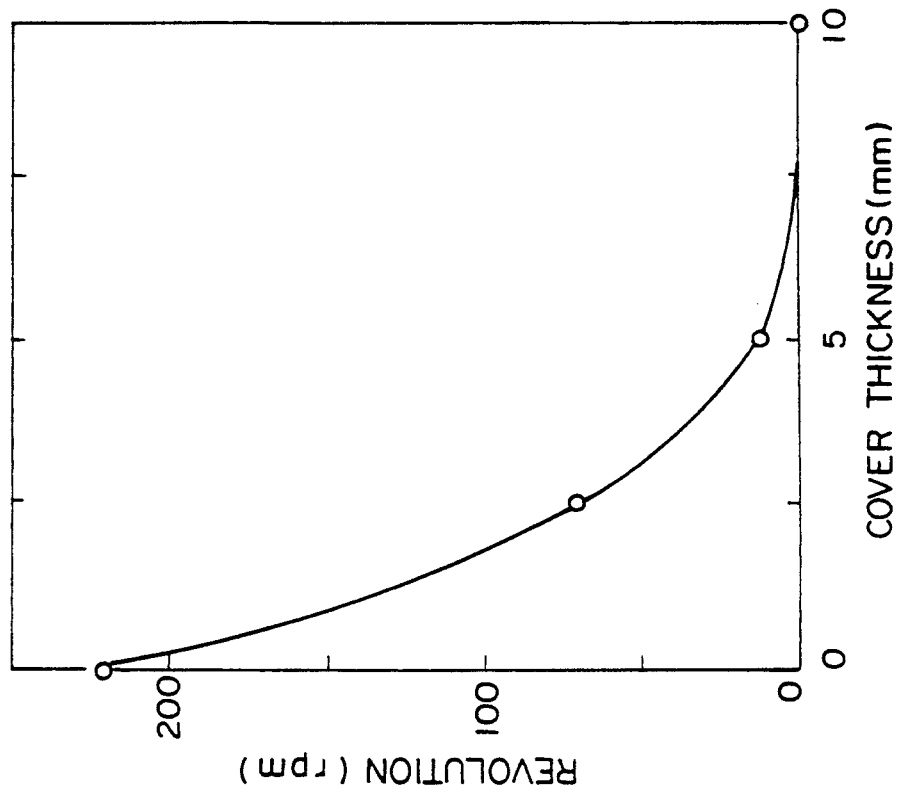
FIG. 29 represents a relationship between the cover thickness of the piezoelectric vibrator and the revolution of the vibrator-type actuator.
Figure 30:
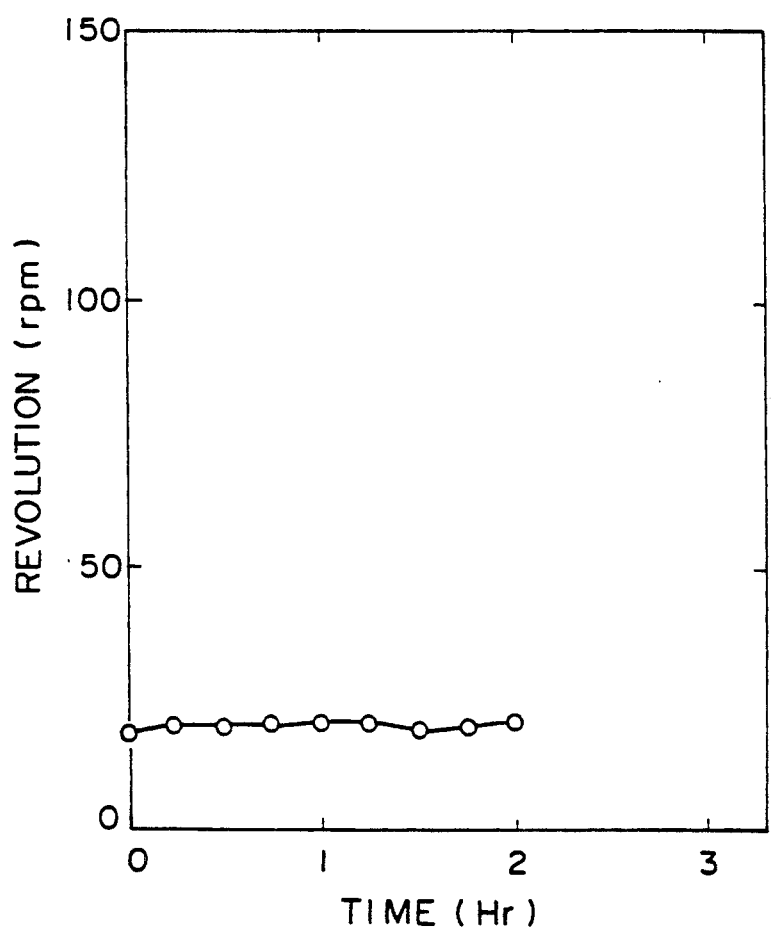
FIG. 30 represents a revolution change with time of another embodiment of a vibrator-type actuator.

FIG. 29 shows a relationship between the thickness of the cover of the piezoelectric vibrator and the revolution of the vibrator-type actuator. As is understood from FIG. 29, the revolution of the actuator decreases with an increase in the thickness of the aluminum cover of the piezoelectric vibrator. The revolution variation is negligible for a piezoelectric vibrator having a cover of 2.5 mm in thickness, as shown in FIG. 30.

Figure 31:
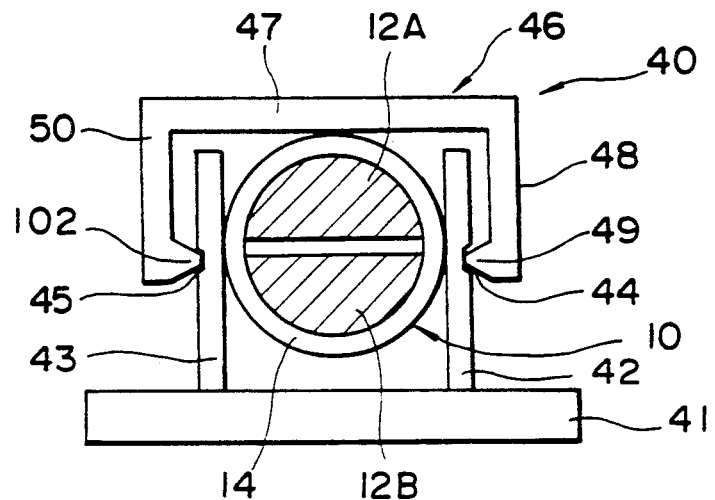
FIG. 31 is a front view of another embodiment of the vibrator-type actuator.
Figure 32:
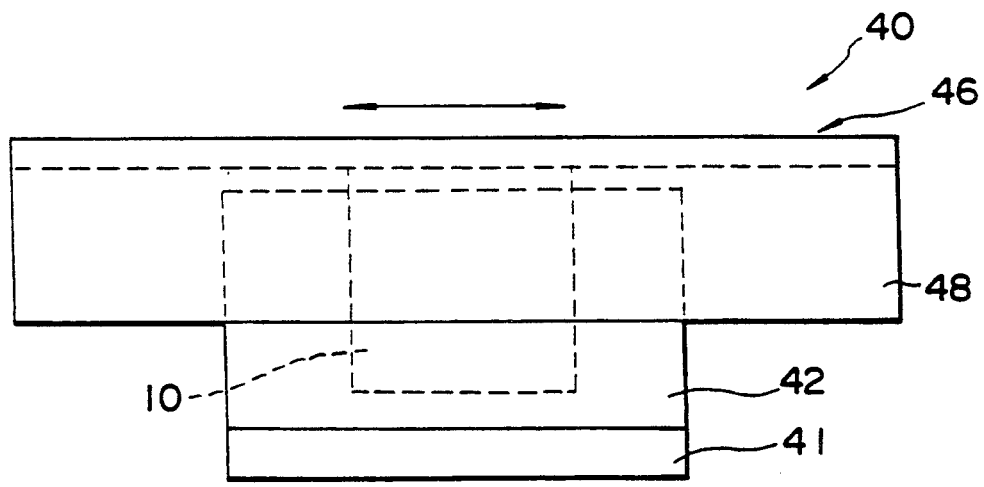
FIG. 32 is a side view of the vibrator-type actuator in FIG. 31.

FIGS. 31 and 32 illustrate a vibrator-type actuator 40 which converts the vibration displacement of the piezoelectric vibrator 10 (FIG. 17) into a linear movement. The vibrator-type actuator 40 includes a rectangular support plate 41, to the upper surface of which the edges of a pair of support members 42, 43 are secured. Each of the support members 42, 43 is comprised of metal-made rectangular plate. One side surface of the support member 42 is opposed to one side surface of the support member 43. On the other surfaces of the support members 42 and 43 grooves 44 and 45 are formed, which extend parallel to the support plate 41.

The piezoelectric vibrator 10 having an axis parallel to the support plate 41 is disposed between the support members 42 and 43. The contact portions of the cover 14 of the piezoelectric vibrator 10 with the support members 42 and 43 are fixed. Against the outer circumferential surface of the cover 14, located at the highest position of the piezoelectric vibrator 10, is a moving element 46 which has a plate portion 47 extending parallel to the support plate 41 and one surface of which contacts with the outer circumferential surface of the cover 14. One edge portion along the longitudinal direction of the plate portion 47 is integrally connected with a guide portion 48 which extends parallel to the support member 42 from one edge of the plate portion 47 to the support plate 41. A tip portion 49 extending along the groove 44 and inserted therein is provided opposite to the groove 44. A guide portion 50 is also integrally connected with the other edge of the plate portion 47 along the longitudinal direction of the plate 47. The guide portion 50 is provided with a tip portion 51 extending along a groove 45 and inserted therein. The moving element 46 contacts with the outer circumferential surface of the cover 14 of the piezoelectric vibrator 10 by its own weight.

For driving the vibrator-type actuator 40, the alternating signal is applied to the electrode 12A or 12B of the piezoelectric vibrator 10. Vibration displacement in the axial direction is caused on the contact portion of the cover 14 with the moving element 46.

The heat generated by the driven piezoelectric vibrator 10 is effectively radiated through the metal-made cover 14. Since the support members 42, 43 contact with the cover 14 formed of metal, the heat of the piezoelectric vibrator 10 is also effectively radiated through each of the support members 42, 43. This results in suppressing the temperature rise of the piezoelectric vibrator 10 and reducing the variation of the resonance frequency of the piezoelectric vibrator 10 due to the temperature rise. Furthermore, since the cover 14 has greater superior wear resistance than the piezoelectric material, the velocity variation of the moving element 46 due to shaved waste is suppressed.

Another embodiment of the present invention resides in an improved securing structure of the piezoelectric vibrator used for actuating the vibrator-type actuator.

As is described in the foregoing embodiment the piezoelectric vibrator is supported by two support members through the rubber member. In this case, the vibration displacement is caused on the contact portion of the piezoelectric vibrator with the rubber member, moving the piezoelectric vibrator relative to the rubber member. This results in decreasing utilization efficiency of the vibration displacement on the piezoelectric vibrator. The present embodiment solves this problem.

Figure 33:
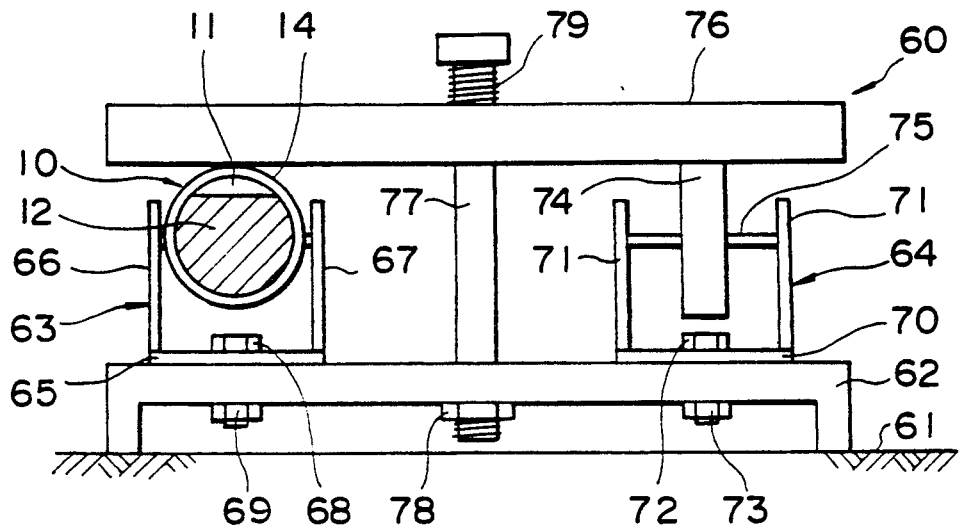
FIG. 33 represents an embodiment of the structure of the vibrator-type actuator according to the invention.
Figure 34:
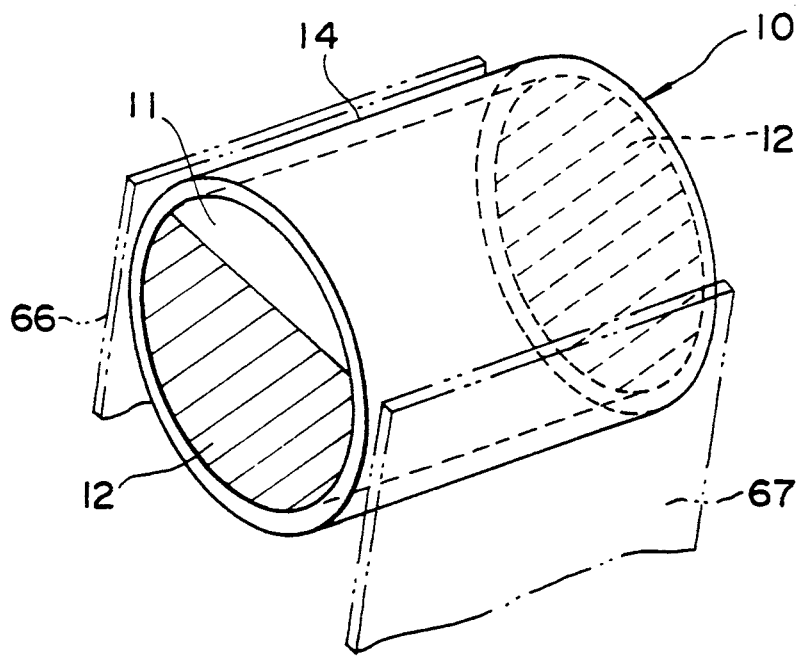
FIG. 34 is a perspective view of the piezoelectric vibrator of FIG. 33.

As shown in FIG. 33, the piezoelectric vibrator 10 has a cylindrical piezoelectric body 11, an axis of which is coincident with the polarized axis thereof. On a part of one end surface an electrode 12 is formed and on the other whole end surface an electrode 13 is formed. A cover 14 covers the whole outer circumferential surface of the piezoelectric body 11 and is formed of phosphorus bronze 0.05 mm in thickness.

The vibrator-type actuator 60 includes a support plate 62 on a support surface 61. The support plate 62 comprises a disk plate portion and a projection portion unifiedly or integrally connected with the edge of the plate portion and extending toward the support surface 61. The support plate 62 is provided with two support portions 63, 64. The support portion 63 has a rectangular flat plate 65 on the disk plate portion of the support plate 62. At the end portions of the flat plate 65 there are provided support plates 66 and 67 extending vertically therefrom. The support plates 66, 67 are made from brass. The flat plate 65 is secured on the disk portion through a bolt 68 and a nut 69. The support portion 64 also has a flat plate 70 and a pair of support plates 71 secured to the disk plate through a bolt 72 and a nut 73.

The support portion 63 supports the piezoelectric vibrator 10 disposed between the support plates 66 and 67. The axial direction of the vibrator 10 is coincident with the tangential direction of the disk portion of the support plate 62. The outer circumferential surface of the piezoelectric vibrator 10 protrudes upwardly from the support plate 66. The cover 14 is soldered at the opposed portions to the support plates 66 and 67, respectively. The support portion 64 supports a bearing 74 so as to be rotatable around a horizontal axis 75. The height of the bearing 74 from the support plate 62 of the outer circumferential surface is equal to that of the cover surface 14 from the support plate 62. A rotating element 76 supported by a bolt 77 and a nut 78 is pressed against the outer surface of the cover 14 and the outer circumferential surface of the bearing 74. A spring member 79 is provided between the head portion of the bolt 77 and the rotating element 76.

When the alternating signal having the resonance frequency of the piezoelectric vibrator 10 is applied to the piezoelectric vibrator 10 through the electrode 12, the vibration displacement from the piezoelectric body 11 is transmitted to the outer surface of the cover 14. This causes an extremely small vibration displacement on the soldered portion of the cover 14 so that the soldering of the cover 14 to each of the support members 66, 67 gives little influence on the vibration distribution. The piezoelectric vibrator 10 is not moved relative to each of the support members 66, 67. This provides constant strength (magnitude) and unidirectionality of the vibration displacement to the rotating element 76 from the cover 14, thereby making the revolution of the vibration-type actuator 60 constant.

Figure 35:
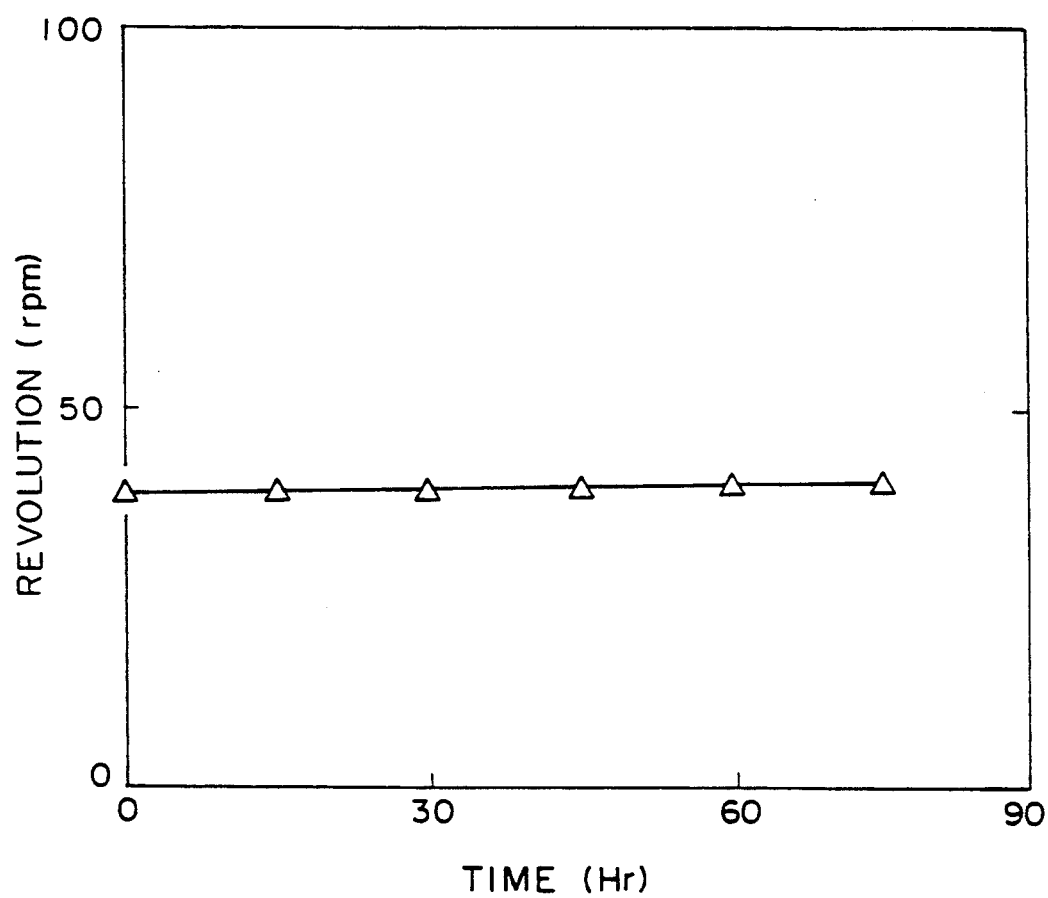
FIG. 35 represents a revolution change of the vibrator-type actuator with driving time.

FIG. 35 represents an experimentally obtained relationship between driving time and variation of the revolutions of the vibrator-type actuator. It is understood from FIG. 35 that the variation rate of the revolutions is remarkably suppressed. For example, the variation rate of the revolution for the driving time of 75 minutes is ±0.64%. Due to the large heat conductivity of the cover 14 the heat generated from the piezoelectric body 11 may be effectively radiated through the cover 14 and the support members 66, 67 so that the temperature rise and the resonance frequency variation may be suppressed.

Figure 36:
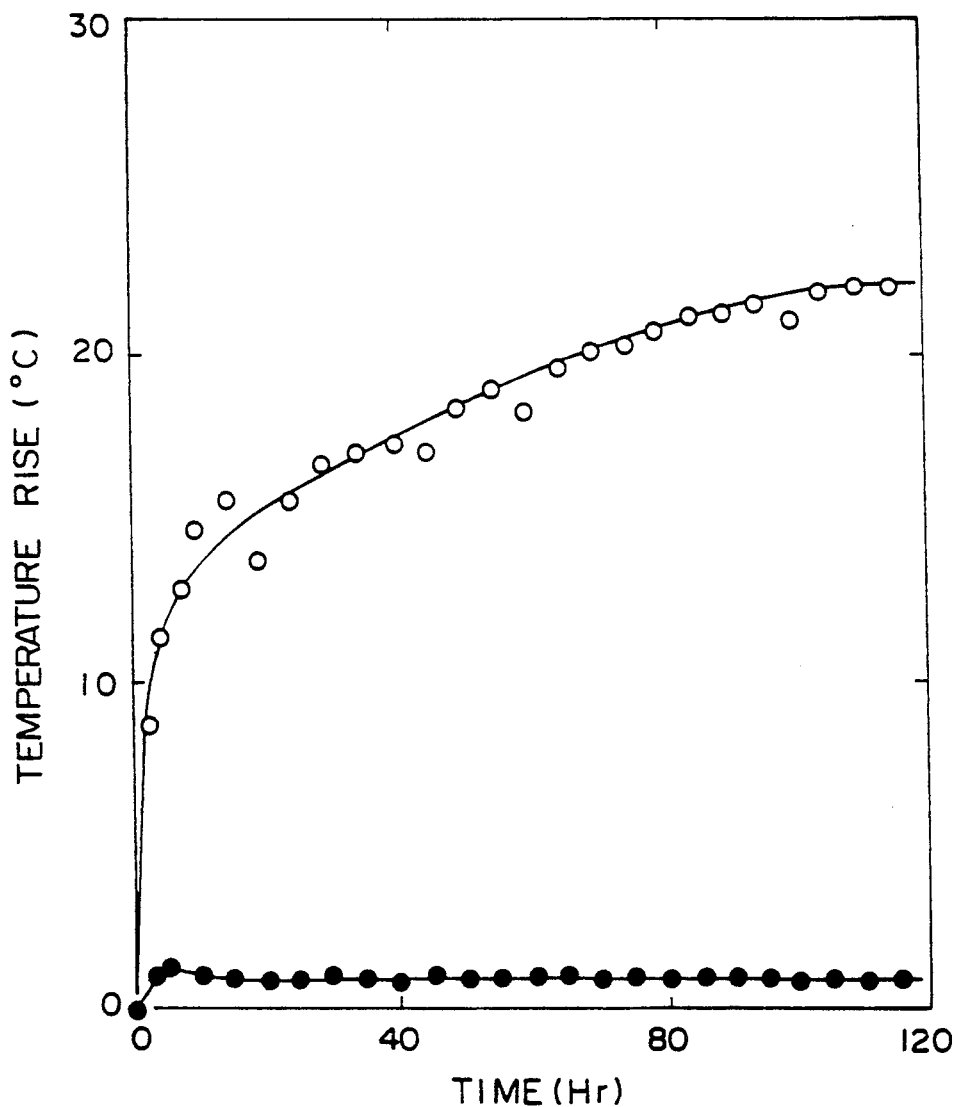
FIG. 36 represents a temperature change of the vibrator-type actuator with driving time.

In FIG. 36, there is shown a relationship between the driving time of actuation and the temperature variation of the piezoelectric vibrator 10. Black circle ● represents the temperature change of the above described piezoelectric vibrator, and white circle ○, that of the vibrator having no cover 14. Remarkable improvement in temperature variation may be achieved by this embodiment.

Figure 37:
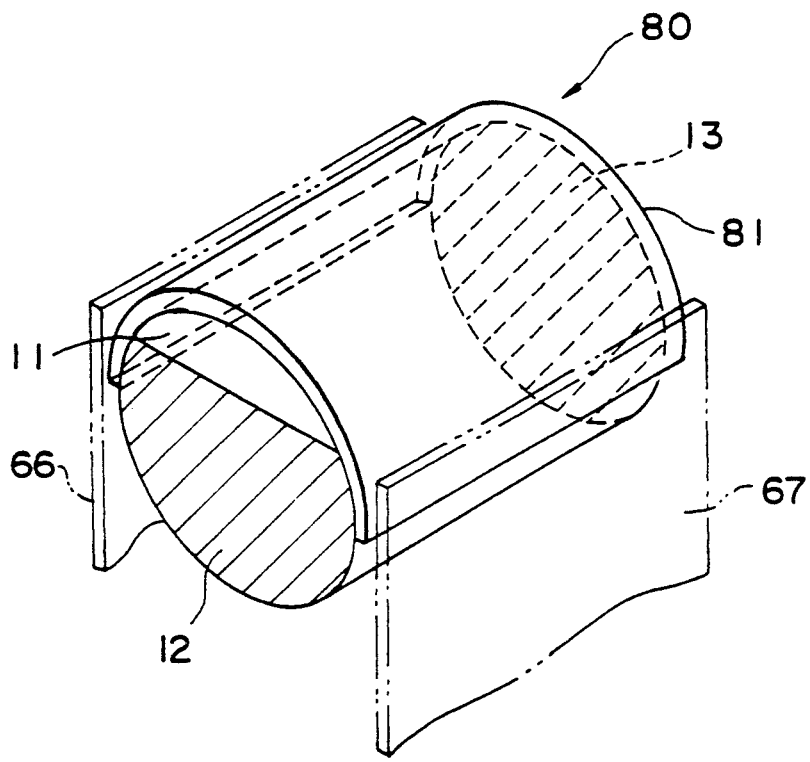
FIGS. 37 and 38 are perspective views of other piezoelectric vibrators used in the actuator of FIG. 33.
Figure 38:
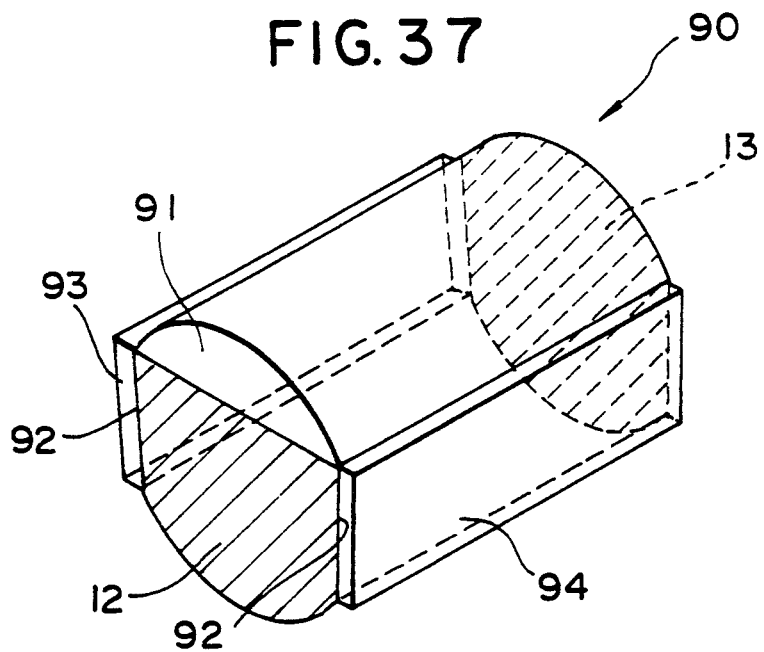
Figure 39:
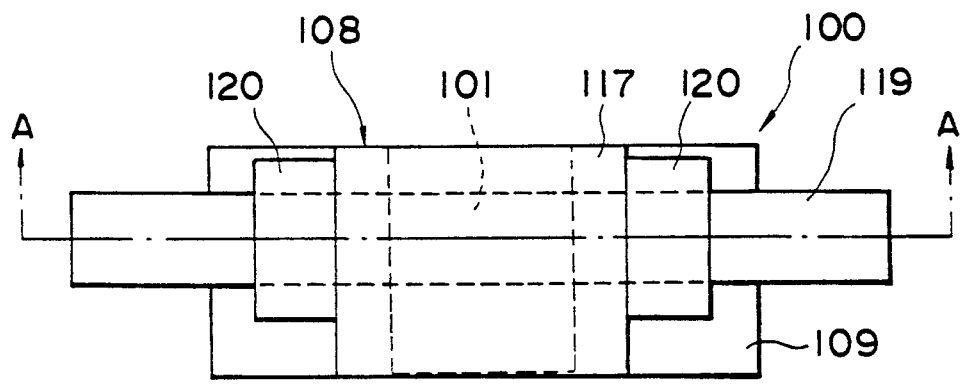
FIGS. 39, 40, 41, 42 and 43 illustrate another embodiment of a vibrator-type actuator, a plan view, a front view, a side view, a sectional view along lines A—A of FIG. 39 and a perspective view of the piezoelectric vibrator used in the vibrator-type actuator of FIG. 39, respectively.
Figures 40, 41:
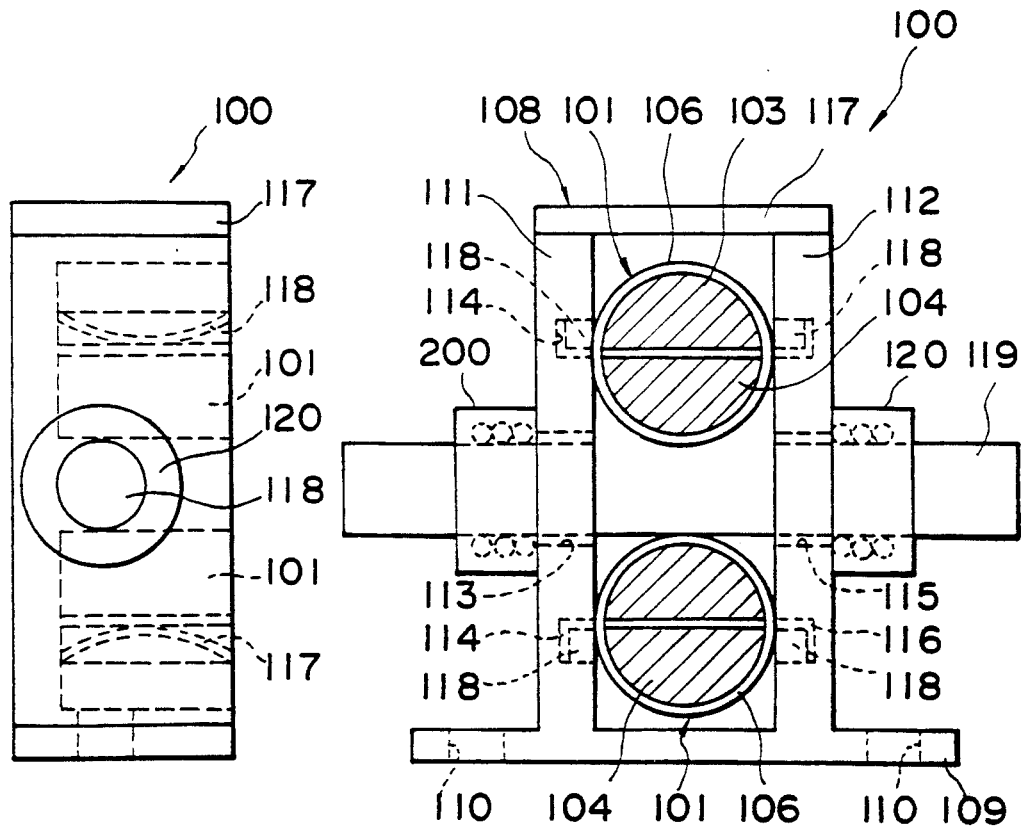
Figure 42:
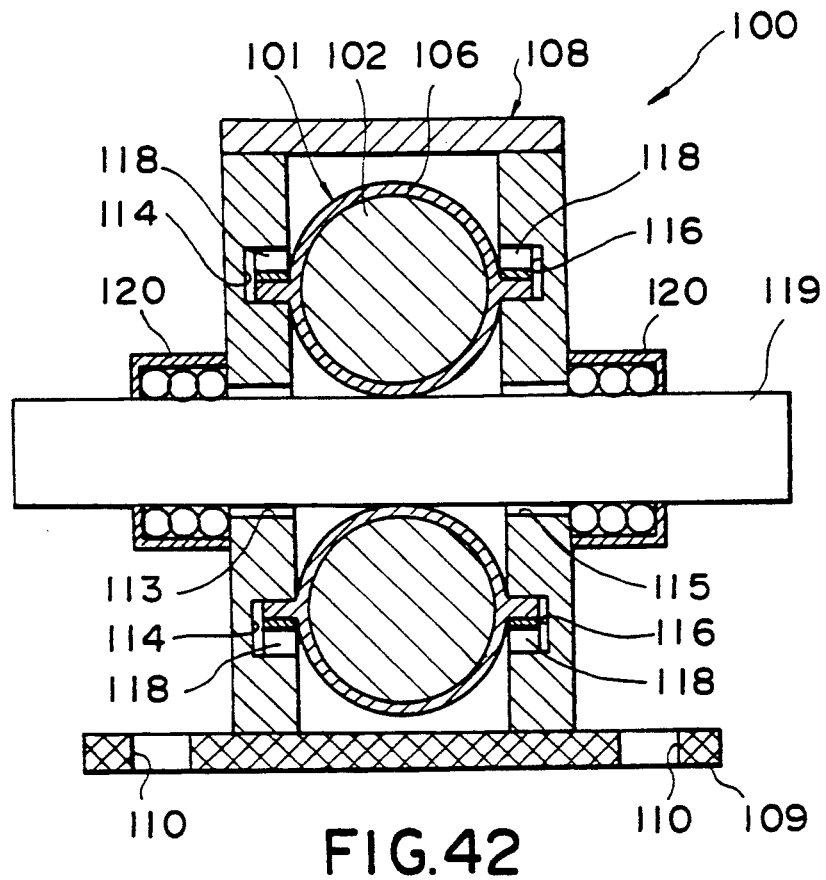

FIGS. 37 and 38 show other piezoelectric vibrators. A piezoelectric vibrator 80 comprises a cylindrical piezoelectric body 11 as shown in FIG. 37. On one end surface of the piezoelectric body 11 an electrode 13 is formed. The cover 81 of phosphorus bronze is formed on half of the outer circumferential surface. One edge portion of the cover 81 along the axis direction of the piezoelectric body 11 is soldered to a support plate 66, while the other edge portion to a support plate 67.

A piezoelectric vibrator 12 shown in FIG. 38 comprises a piezoelectric body 91 on the outer circumferential surface of which a pair of opposed and parallel flat surfaces 92 are formed. The electrodes 12 and 13 are respectively formed on end surfaces of the piezoelectric body 91. Covers 93 and 94 made of phosphorus bronze are formed on the flat surface 92 and soldered to the support plates 66 and 67, respectively.

Figure 43:
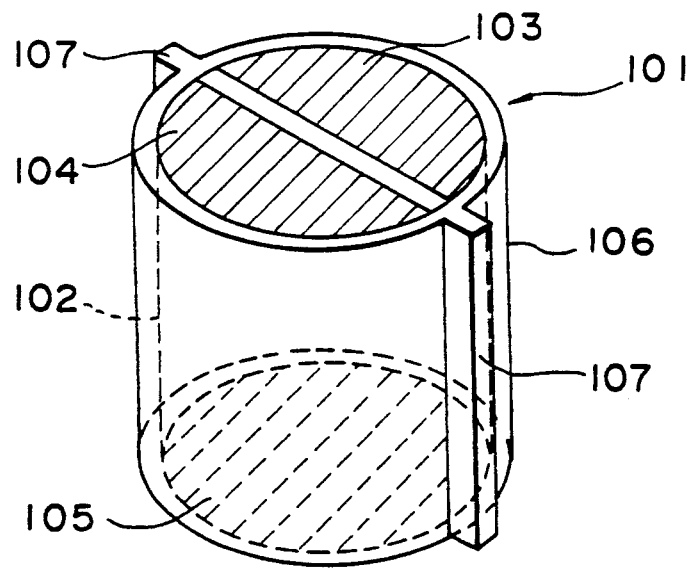

FIGS. 39 to 43 show another vibrator-type actuator 100 comprising a pair of piezoelectric vibrators 101 each having a cylindrical piezoelectric body 102, as shown in FIG. 43. A pair of electrodes 103, 104 insulated from each other are formed on one end surface of the piezoelectric body 102 while an electrode 105 is formed on the other whole end surface. A cover 106 made of metal material is formed on the whole outer circumferential surface of the piezoelectric body 102. A pair of rectangular projections 107 made of metal material are provided at two opposed portions of the cover 106 in the radial direction of the piezoelectric body 102.

Each piezoelectric vibrator 101 is encased in a housing 108 having a base portion 109 secured to the support plane. The base portion 109 is formed from rectangular plate material and provided with a pair of holes 110 which may receive a fixing member. The base portion 109 connects a pair of support portions 111, 112 extending vertically therefrom with an interval. The support portions 111, 112 are made from a rectangular plate and are arranged parallel and opposite to each other. A pair of recess portions 114 are formed on the opposed surface of the support portion 111 to the support portion 112. Each recess portion 114 extends in parallel to the base portion 109. One recess portion 114 is arranged at the upper portion of the hole 113, while the other recess portion 114 at the lower position of the hole 113. The support portion 112 is also provided with a hole 115 and a pair of recess portions 116. The upper ends of the support portion 111 is connected with the upper end of the support portion 112 through a connecting portion 117.

A pair of piezoelectric vibrators 101 are vertically arranged with an interval between the support portions 111 and 112. One projection 107 of one piezoelectric vibrator 101 is inserted into the recess portion 114 and the other projection 107 into the recess portion 116. One projection 107 is pressed against the other piezoelectric vibrator 101 by a spring member 118 provided in the recess portion 114. The spring member 118 may be a plate spring and both ends of which are secured to the support portion 111. The other projection 107 is similarly secured in the recess portion 116 by the spring member 118.

In a similar way, the other piezoelectric vibrator 101 is secured to the support portions 111 and 112 by the paired spring members 118 and recess portions 114 below the support portions 111 and 112. The other piezoelectric vibrator 101 is pressed against one of the piezoelectric vibrators 101 by the spring member 118. Between the two piezoelectric vibrators 101 provided is an output axis 119 extending from the support portion 111 through the holes 113 and 115. The output axis 119 is supported by bearings 120 provided in the support portions 111 and 112 and pressed against the outer surfaces of the respective covers 106 of the piezoelectric vibrator 101. One end of the output axis 119 may be connected with the driving side and the other end thereof may be provided with a revolution detection device such as a rotary encoder.

When the vibrator-type actuator 100 is driven, there results a very small vibration displacement on the projection 107 integrally connected with the cover 106. The vibration displacement on the portion of the cover 106 made to contact with the output axis 119 is transmitted to the output axis 119, thereby rotating the output axis 119. Since the vibration displacement on each projection 107 is negligible, the contact portion of the cover 106 with the output axis 119 is not changed or shifted, realizing stable rotation by the vibrator-type actuator 100.

Figure 44:
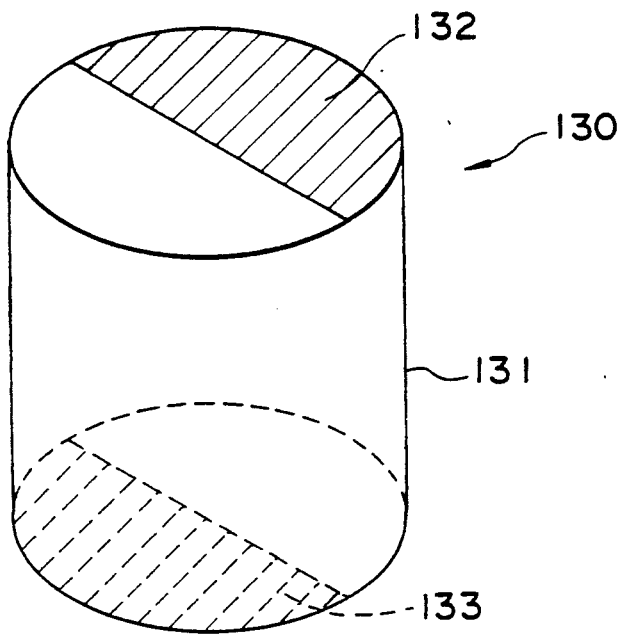
FIGS. 44 and 45 are perspective views of two types of piezoelectric vibrators for explaining the invention.

FIG. 44 shows another embodiment of the present invention producing a large vibration displacement with a low alternating voltage application.

Figure 45:
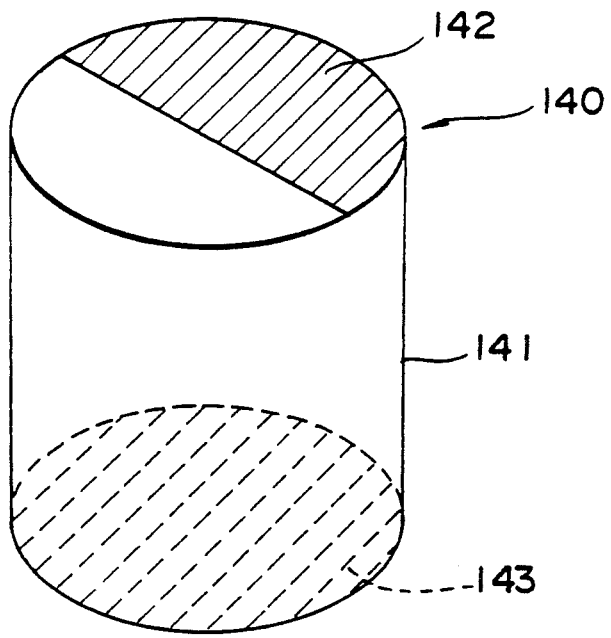
Figure 46:
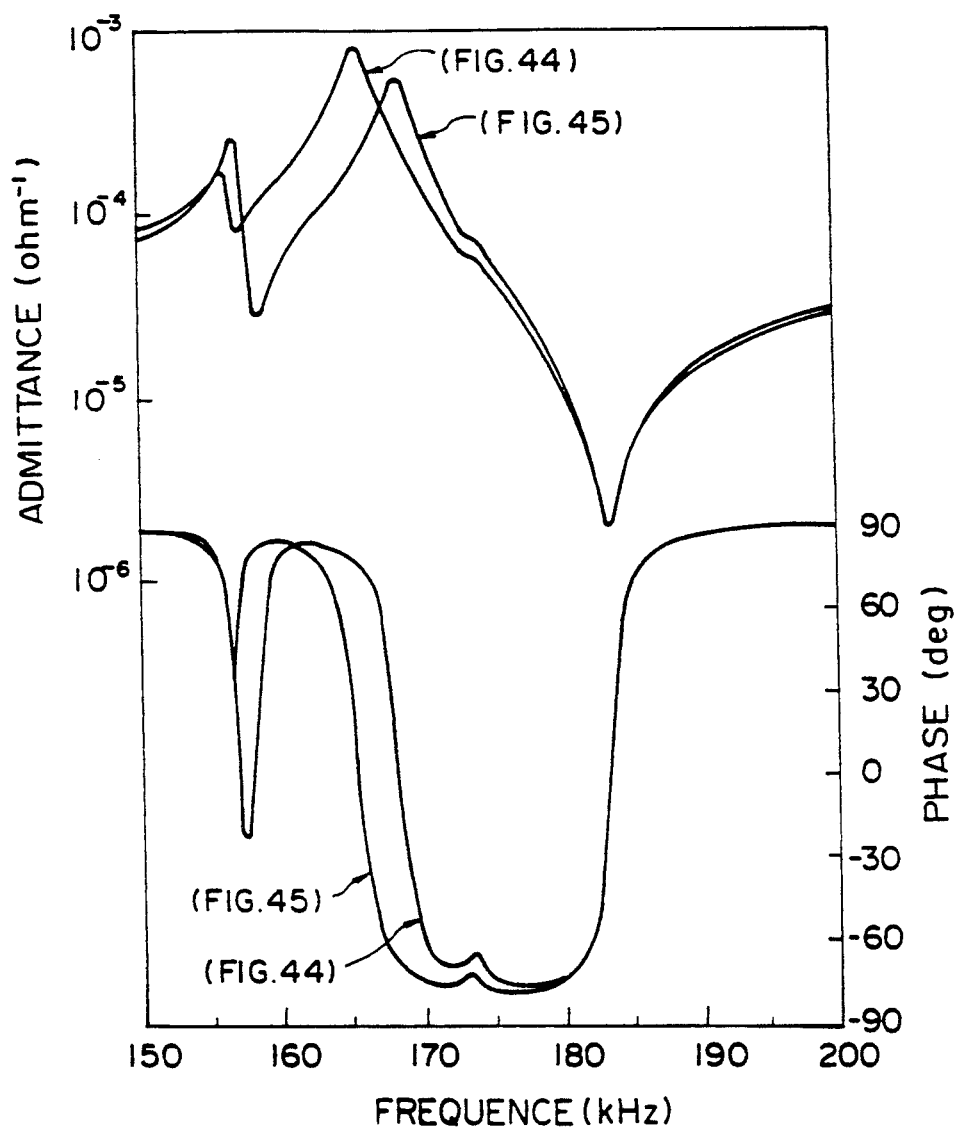
FIG. 46 represents frequency characteristics of magnitude and phase of the free admittance of the piezoelectric vibrators shown in FIGS. 44 and 45.

A piezoelectric vibrator 130 has a cylindrical piezoelectric body 131 whose axis is coincident with the polarization axis. Both end surfaces of the piezoelectric body 131 are essentially perpendicular to the axis thereof and the body is 10 mm in length and 10 mm in diameter. A semi-circular electrode 132 is formed on one end surface of the piezoelectric body 131 and an electrode 133 having the same shape and size as that of the electrode 132 is formed on the other end surface. The electrodes 132 and 133 are symmetrically arranged with respect to the center point of the piezoelectric body 131. As a result, the electrodes 132 and 133 are asymmetrically formed with respect to a plane perpendicular to the axis of the piezoelectric body 131, resulting in split resonance frequencies around the first resonance frequency (the lowest resonance frequency). In the embodiment of FIG. 45, a similar electrode 142 is formed on one end surface of a piezoelectric body 141 and an electrode 143 is formed on the whole end surface for the piezoelectric body 140. Referring to FIG. 46, the lower and higher frequencies of the first split resonance frequencies are 156 kHz and 168 kHz, respectively. Namely, the piezoelectric vibrator 130 has two resonance frequencies, 156 kHz and 168 kHz.

Upon application of an alternating signal at the lower resonance frequency 155.8 kHz to the piezoelectric vibrator 130 through the electrode 132, the piezoelectric vibrator 130 is driven and the vibration displacement is caused on the outer circumferential surface of the piezoelectric body 131. The maximum vibration displacement is caused around the projection portion of the one end surface where the electrode is not formed in the direction toward the electrode 132 along the axis of the piezoelectric body 131.

When an alternating signal at the higher resonance frequency 168 kHz is fed to the piezoelectric vibrator 130 through the electrode 14, it was experimentally confirmed that on the outer circumferential surface of the piezoelectric body 131 the vibration displacement is caused in the direction opposite to that for the lower resonance frequency. The vibration displacement increases with increase in frequency ranging from a certain frequency $f_a$ to 156 kHz and the maximum vibration displacement is caused at 156 kHz in the direction toward the electrode 132. On the other hand, the vibration displacement decreases with increase in frequency ranging from 156 kHz to a certain frequency $f_b$ kHz. There was no vibration displacement caused at $f_b$ kHz. The vibration displacement increases with increase in frequency ranging from $f_b$ kHz to 168 kHz and its displacement direction is reversed at 168 kHz. The reversed maximum vibration displacement is caused thereat.

The vibration displacement of the piezoelectric body 130 decreases with increase in frequency ranging from 168 kHz to a certain frequency $f_c$ kHz without any vibration direction change. At the frequency of $f_c$ no vibration displacement is caused on the outer circumferential surface of the piezoelectric body 12.

Figure 47:
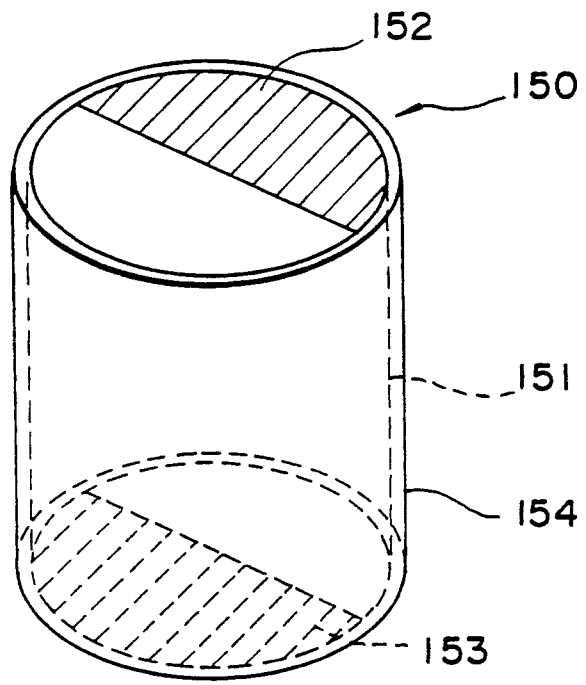
FIG. 47 is a perspective view of another embodiment of a piezoelectric vibrator according to the invention.

As is clear from the foregoing description, the magnitude and the direction of the vibration displacement caused on the outer circumferential surface of the piezoelectric body 130 may be arbitrarily controlled by changing the frequency of the alternating signal to be applied to the piezoelectric vibrator 10. It is experimentally confirmed that the vibration displacement of the piezoelectric vibrator 130 is larger than that of the piezoelectric vibrator 140. In other words, a required vibration displacement may be produced by applying a smaller, alternating signal voltage than the voltage required for the conventional structure, and yet the variation of the resonance frequency due to temperature rise may be decreased. Preferably the cover is formed on the side surface of the piezoelectric body as shown in FIG. 47 in order to improve the radiation and wear resistance characteristics. The piezoelectric vibrator 150 includes a cover 154 formed on the outer circumferential surface of the piezoelectric body 151. The cover 154 may be made of phosphorus bronze and can be 50 μm in thickness.

Figure 48:
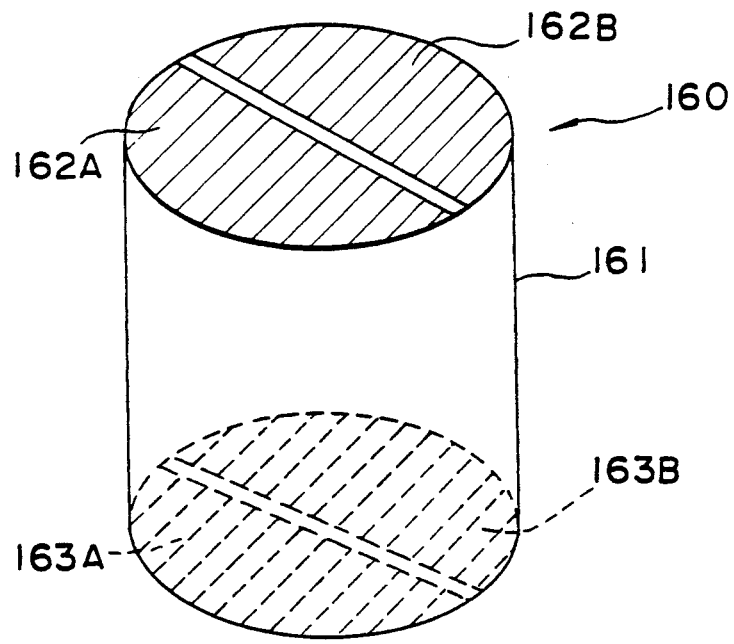
FIG. 48 is a perspective view of another embodiment of a piezoelectric vibrator according to the invention.

As shown in FIG. 48, the piezoelectric vibrator 160 includes a cylindrical piezoelectric body 161 on one end surface of which a pair of semi-circle electrodes 162A and 162B are formed. The electrodes 162A and 162B are separated and insulated from each other. On the other end surface of the piezoelectric body 161 a pair of similar semi-circular electrodes 163A and 163B are formed. The electrodes 162A and 163A are symmetric to each other with respect to a plane essentially perpendicular to the axis of the piezoelectric body 161. The electrodes 162B and 163B are also symmetric to each other.

Due to asymmetry of the electrodes 162A and 163B, an asymmetrical element may be introduced into the piezoelectric vibrator 160 by connecting the electrode 162A with an alternating signal source and the electrode 163B to ground. Consequently, the magnitude and direction of the vibration displacement on the piezoelectric vibrator 160 may be arbitrarily controlled by controlling the frequency of the applied alternating signal.

Figure 49:
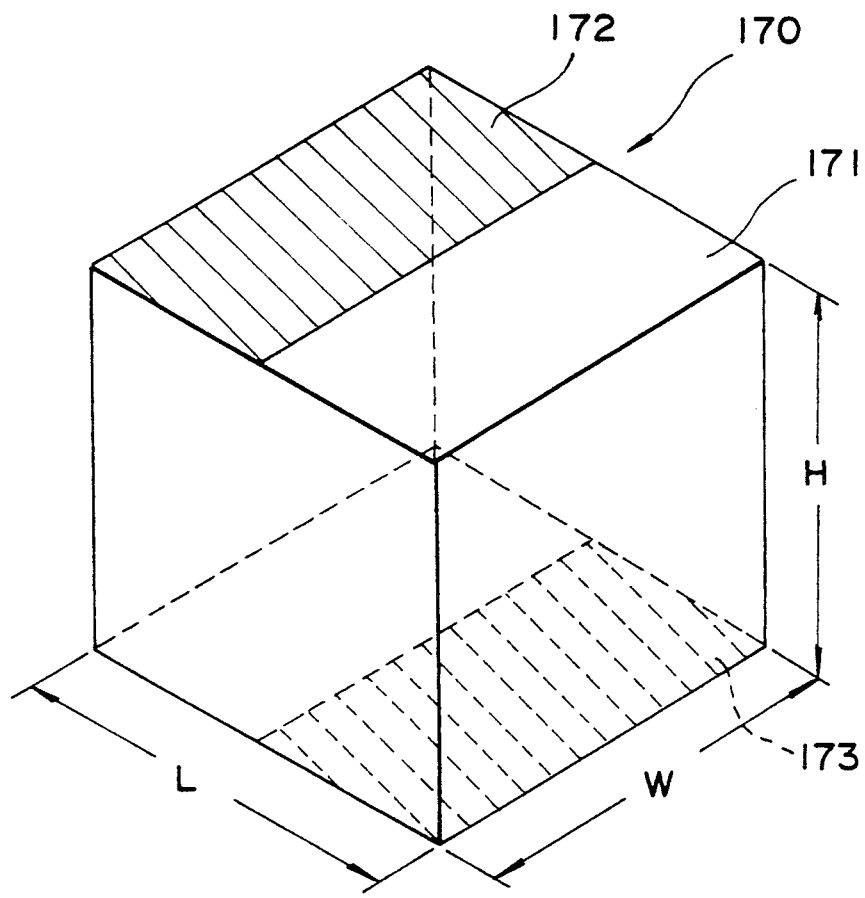
FIG. 49 is a perspective view of another embodiment of a piezoelectric vibrator according to the invention.

Another embodiment is shown in FIG. 49. A piezoelectric vibrator 170 includes a square (cubic) piezoelectric body 171, the axis of which is coincident with the polarization axis. The piezoelectric body 171 is 10 mm in length L, 10 mm in width W and 10 mm in height H. A rectangular electrode 172 is formed on one end surface and an electrode 173 having the same shape and size is formed on the other end surface of the piezoelectric body 171. The electrodes 172 and 173 are symmetrically formed on the end surfaces with respect to the central point of the piezoelectric body 171. Due to the asymmetry of the electrodes 172 and 173 with respect to a plane essentially perpendicular to the axis of the piezoelectric body 171, there results split resonance frequencies around the first resonance frequency (the lowest resonance frequency) of the piezoelectric body 171.

Figure 50:
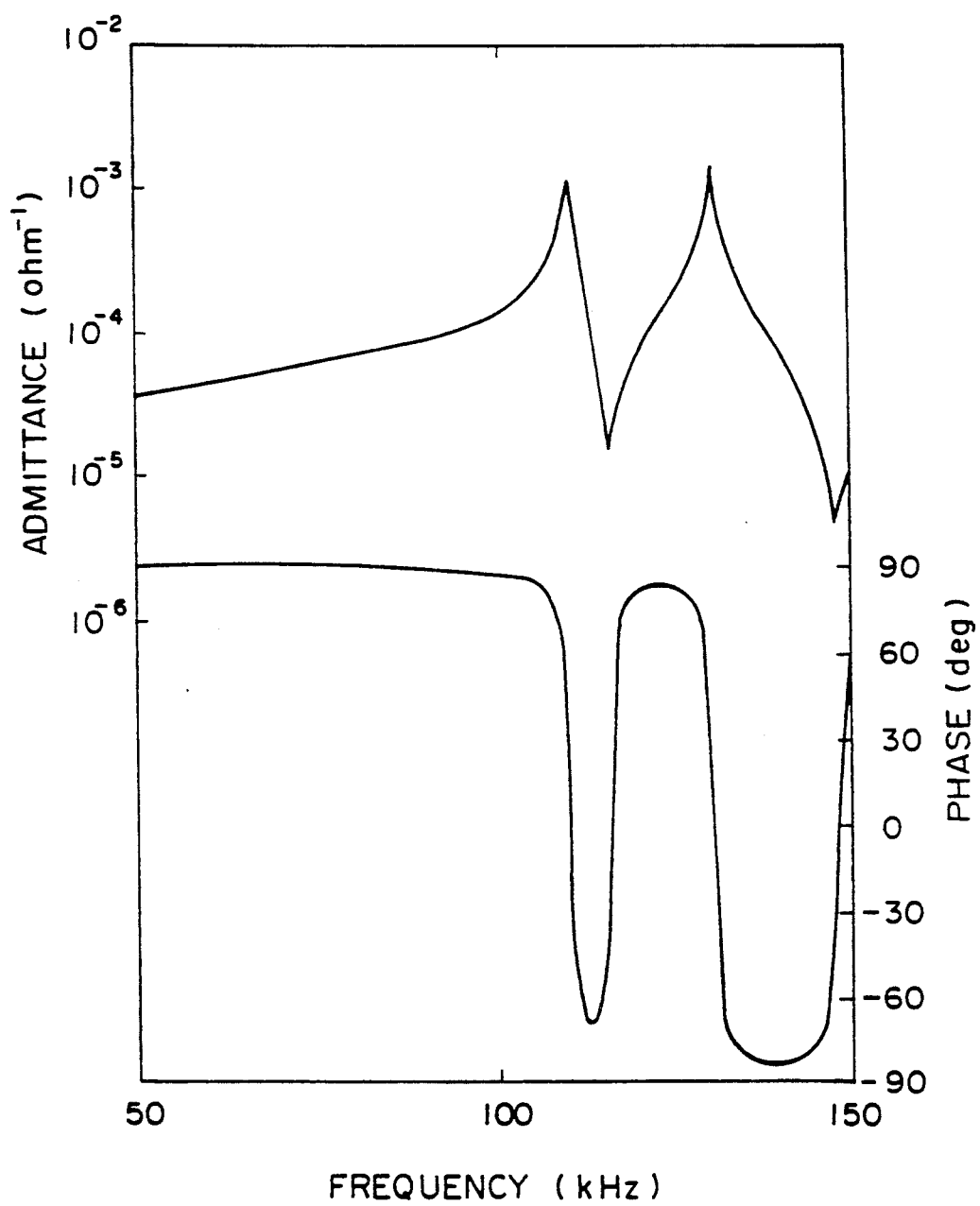
FIG. 50 represents frequency characteristics of magnitude and phase of the admittance amplitude of the piezoelectric vibrator shown in FIG. 49.
Figure 51:
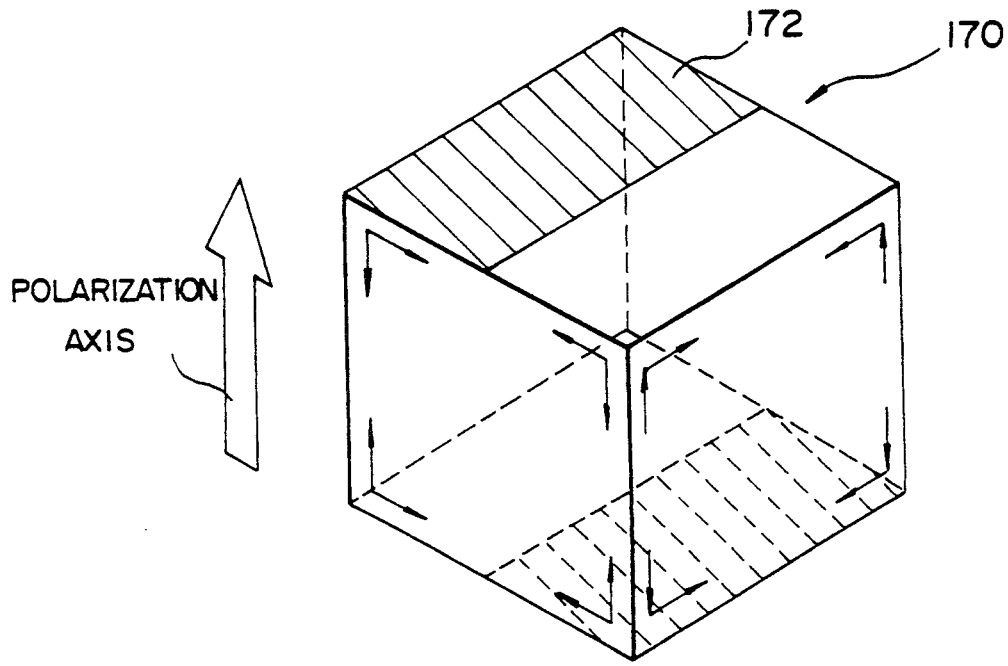
FIGS. 51 and 52 represent the directions of the vibration displacements on the piezoelectric vibrator driven by an alternating signal of different frequencies.
Figure 52:
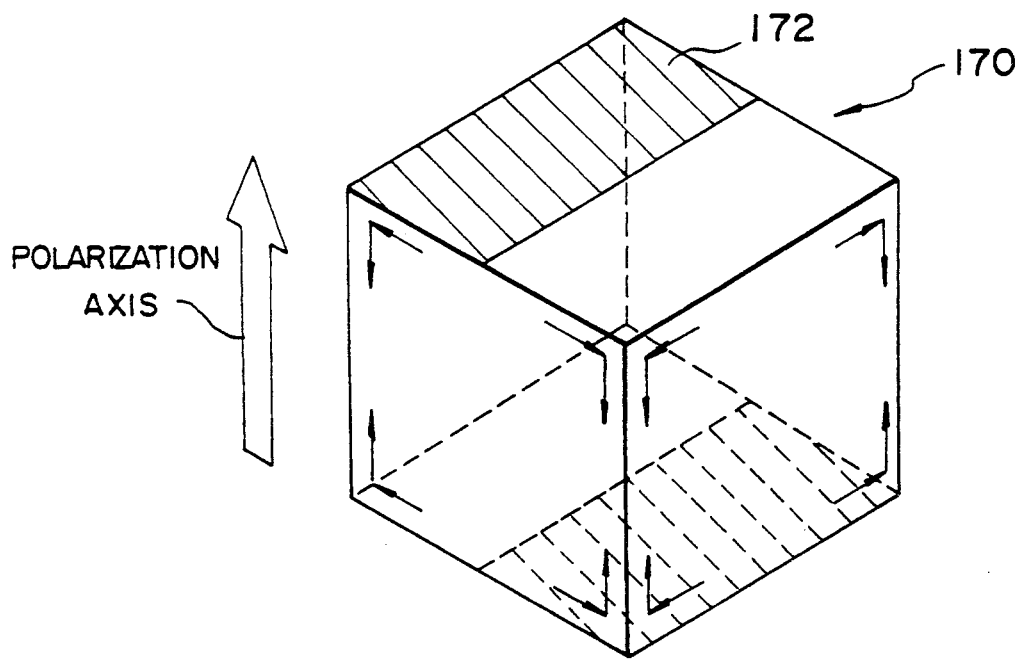

As shown in FIG. 50, the lower and higher frequencies of the split resonance frequencies are 109 kHz and 129 kHz, respectively. Referring to FIG. 51, when the signal of the lower resonance frequency 109 kHz is applied to the piezoelectric vibrator 170 through the electrode 172, the piezoelectric vibrator 170 is driven and the vibration displacement having no directionality is caused on the side surface of the piezoelectric body. As shown in FIG. 52, the vibration displacement is caused when the signal of the higher resonance frequency 129 kHz is applied through the electrode. The direction of the vibration displacement is opposite to that caused by the lower resonance frequency.

Figure 53:
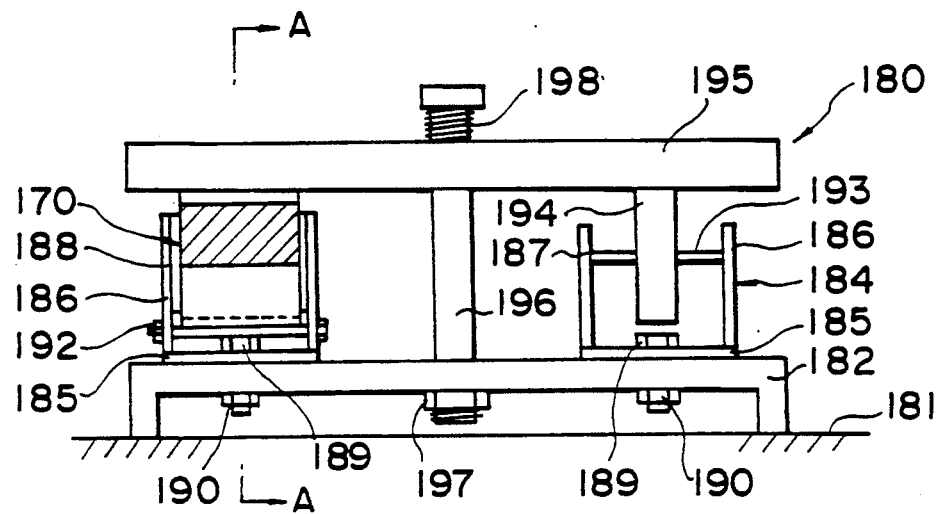
FIGS. 53 and 54 are a front view of the vibrator-type actuator according to the invention and a partial section view along lines A—A of FIG. 53.
Figure 54:
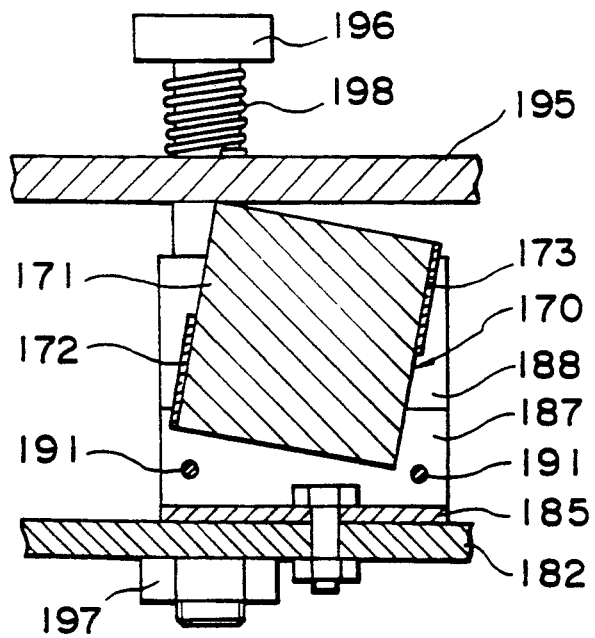

In order to clarify the relationship between the magnitude of the vibration displacement and the frequency and voltage value of the applied alternating signal, a vibrator-type actuator 180 was composed by using the piezoelectric vibrator 170 as the driving source and the output thereof was measured (FIG. 53).

The vibrator-type actuator 180 includes a support plate 182 put on a support surface 181. The support plate 182 comprises a disk portion and leg portions extending along the edge portion of the lower surface of the disk portion and secured to the support plate 181. The support plate 182 is provided with two support means 183, 184. The support means 183 has a rectangular plate 185 positioned on the disk portion of the support plate 182. The support plate 186 upwardly and vertically extends from one edge portion along the width direction of the flat plate 185. The support plate 187, parallel to the support plate 186, is provided at the other edge portion. The support plates 186 and 187 may be made of bronze. A rubber plate member 188 is secured to the inside surfaces of the support plates 186 and 187. The flat plate 185 of the support means 183 is secured to the disk portion of the support plate 182 With a bolt 189 and a nut 190. Similarly, the other support means 184 comprises a flat plate 185 and support plates 186, 187. The flat plate 185 is also secured to the disk portion of the support plate 182 with a bolt 189 and a nut 190.

The support means 183 supports the piezoelectric vibrator 170 sandwiched between the rubber members 188 of the support plates 186 and 187. The rubber member 188 and the side surface of the piezoelectric body 171 are secured to each other with a bolt 191 and a nut 192. One end surface of the piezoelectric body 171 is directed upwardly and diagonally. The edge portion of the side surface of the one end surface corresponding to the edge portion where the electrode 172 is not formed protrudes from the support plate 186. At the support means 184 there is provided an axis 193 extending in parallel to the disk plate in the radial direction of the disk portion. Two edge portions of the axis 193 are secured to the support plates 186 and 187, respectively. The axis 193 supports a bearing 194 of 13 mm in diameter.

A member to be moved such as a steel-made disk plate 195 is arranged on the piezoelectric vibrator 170. The lower surface of the plate 195 is pressed against the outer circumferential surfaces of the piezoelectric body 171 and the bearing 187. The plate 195 is supported by a bolt 196 and a nut 197. A spring member 198 is disposed between the head portion of the bolt 196 and the plate 195. A power source (not shown) connected to the electrodes 172, 173 of the piezoelectric vibrator 170 generates an alternating signal of a frequency f varying 90 kHz to 200 kHz and with a voltage value Vpp up to 200 V. Upon application of the alternating signal to the piezoelectric vibrator 170, the vibration displacement is caused on the side surface of the piezoelectric body 171.

The magnitude and direction of the vibration displacements are determined by the voltage and the frequency of the alternating signal. At the contact portion of the piezoelectric body 171 with the plate 195, stronger vibration displacements are caused as compared to other portions.

The plate 195 is rotated at the velocity corresponding to the magnitude of the vibration displacement. The rotation direction is determined by the direction of the vibration displacement.

Figure 55:
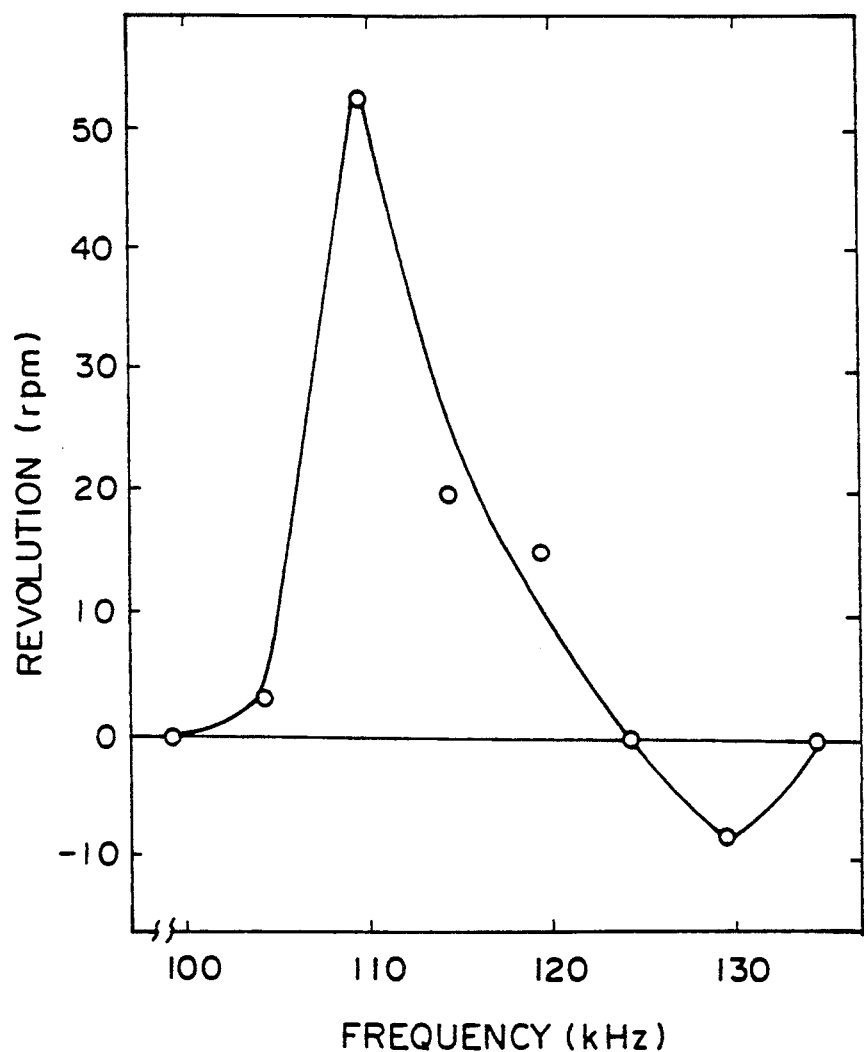
FIG. 55 represents a relationship between the frequency of the alternating signal to be applied to the vibrator-type actuator of FIG. 53 and the output revolutions thereof.

When the applied alternating voltage is maintained at 140 V,, and the frequency f is varied from 90 kHz to 140 kHz, the plate 195 begins rotating at the frequency exceeding 99 kHz as shown in FIG. 55.

When frequency f satisfies the following equation (19), $$99 \text{ kHz} < f < 124 \text{ kHz} \qquad (19)$$

the revolution of the plate 195 varies parabolically and indicates the maximum (52 rpm) at 109 kHz. The magnitude of the vibration displacement varies parabolically with increase in frequency f and the vibration displacement is the maximum at the frequency 109 kHz, that is, when the frequency f of the applied alternating signal is the same as the resonance frequency of the piezoelectric vibrator 170.

Upon application of the alternating signal of 124 kHz the rotation of the plate 195 is stopped and no vibration displacement is caused on the contact portion of the piezoelectric body 171 with the plate 195.

When frequency f satisfies the following Equation (20), $$124 \text{ kHz} < f \leq 134 \text{ kHz} \qquad (20)$$

the revolution of the plate 195 varies parabolically and the rotation direction is reversed. The maximum revolution of the plate 195 is about 10 rpm at 129 kHz. As a result, the magnitude of the vibration displacement to be transmitted from the contact portion of the piezoelectric body 171 with the plate 195 varies parabolically with increase in frequency f and has its maximum value at 129 kHz. In the case where the frequency f is 134 kHz, the rotation of the plate 195 is stopped and no vibration displacement is caused on the contact portion of the piezoelectric body 171 with the plate 195.

Figure 61:
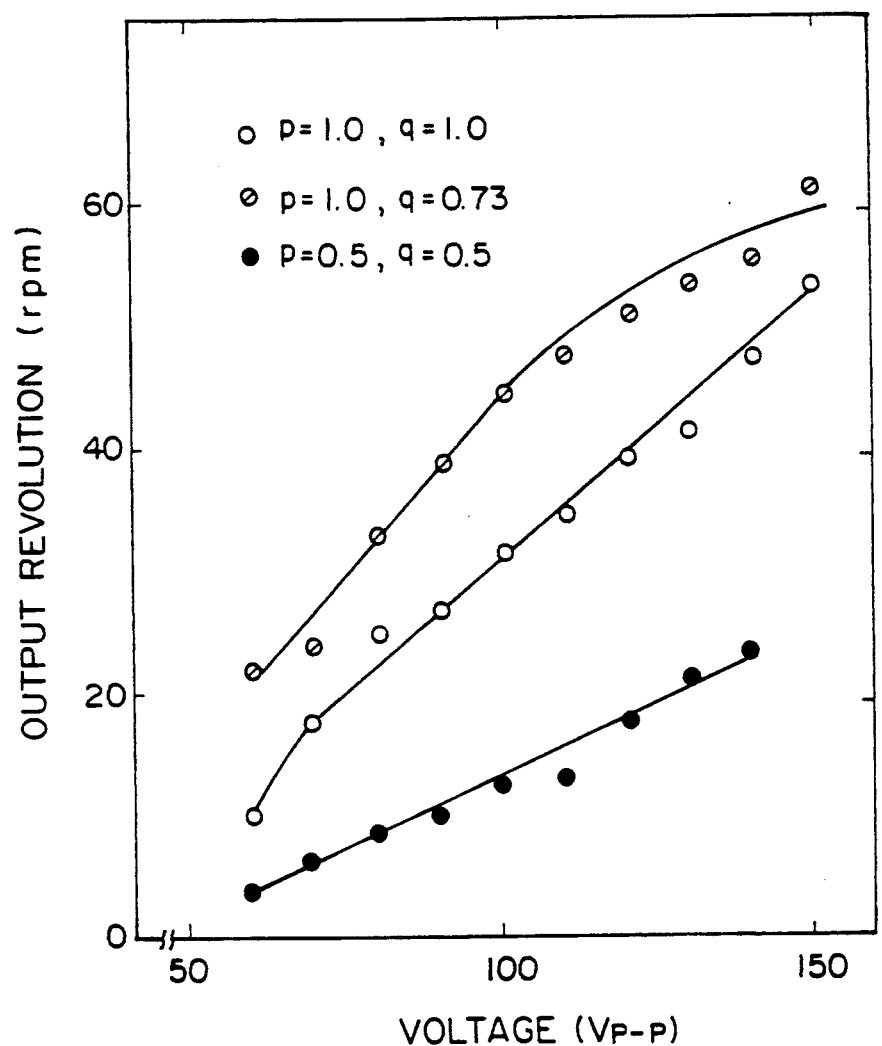
FIG. 61 represents the revolution and the applied alternating voltage of the vibrator-type actuator with the shape ratios of FIG. 60.

FIG. 61 shows a relationship between the revolution of the plate 195 and the alternating voltage. In FIG. 61, a white circle ○ represents the revolutions of the vibrator-type actuator 24 using the piezoelectric vibrator 170. Since the revolution of the plate 195 increases with increase in voltage when the frequency of the applied alternating signal is maintained at 109 kHz, the vibration displacement to be transmitted from the piezoelectric body 171 to the plate 195 becomes large. From the foregoing, it is seen that the magnitude and the direction of the vibration displacement which rotates the plate 195 may be controlled by changing the frequency of the applied alternating signal. The vibration displacement may also be controlled by changing the applied alternating voltage.

Figure 56:
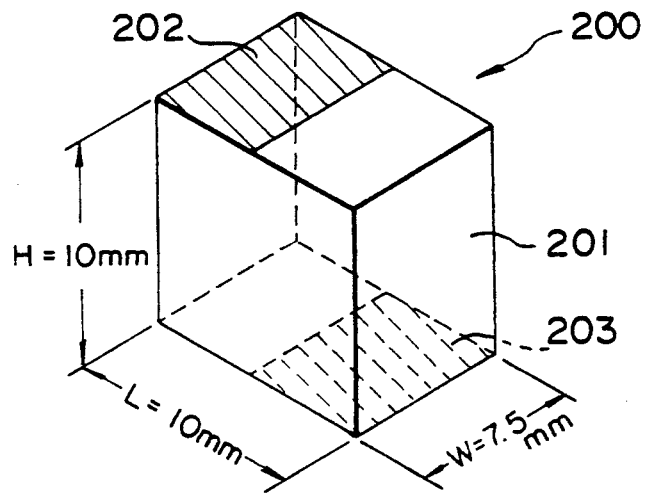
FIGS. 56 and 57 are perspective views of piezoelectric vibrators of the invention.
Figure 57:
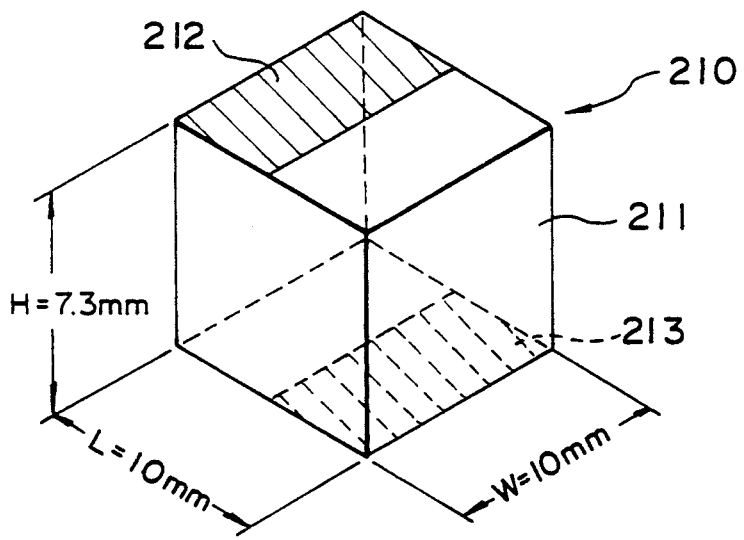

FIGS. 56 and 57 show other piezoelectric vibrators having different shape ratios.

FIG. 56 shows a piezoelectric vibrator 200 having a square-shape piezoelectric body 201 with dimensions L=10 mm in length, W=7.5 mm in width and H=10 mm in height. On one end surface of the piezoelectric body 201 an electrode 202 is formed, and on the other end surface an electrode 203 is formed. A shape ratio p(=W/L) of the piezoelectric vibrator 200 is 0.75 and a shape ratio q(=H/L) is 1.0. Piezoelectric vibrator 210 having a piezoelectric body 211 with dimensions L=10 mm in length, W=10 mm in width and H=7.3 mm in height is shown in FIG. 57. Shape ratios p and q are 1.0 and 0.73, respectively.

Figure 58:
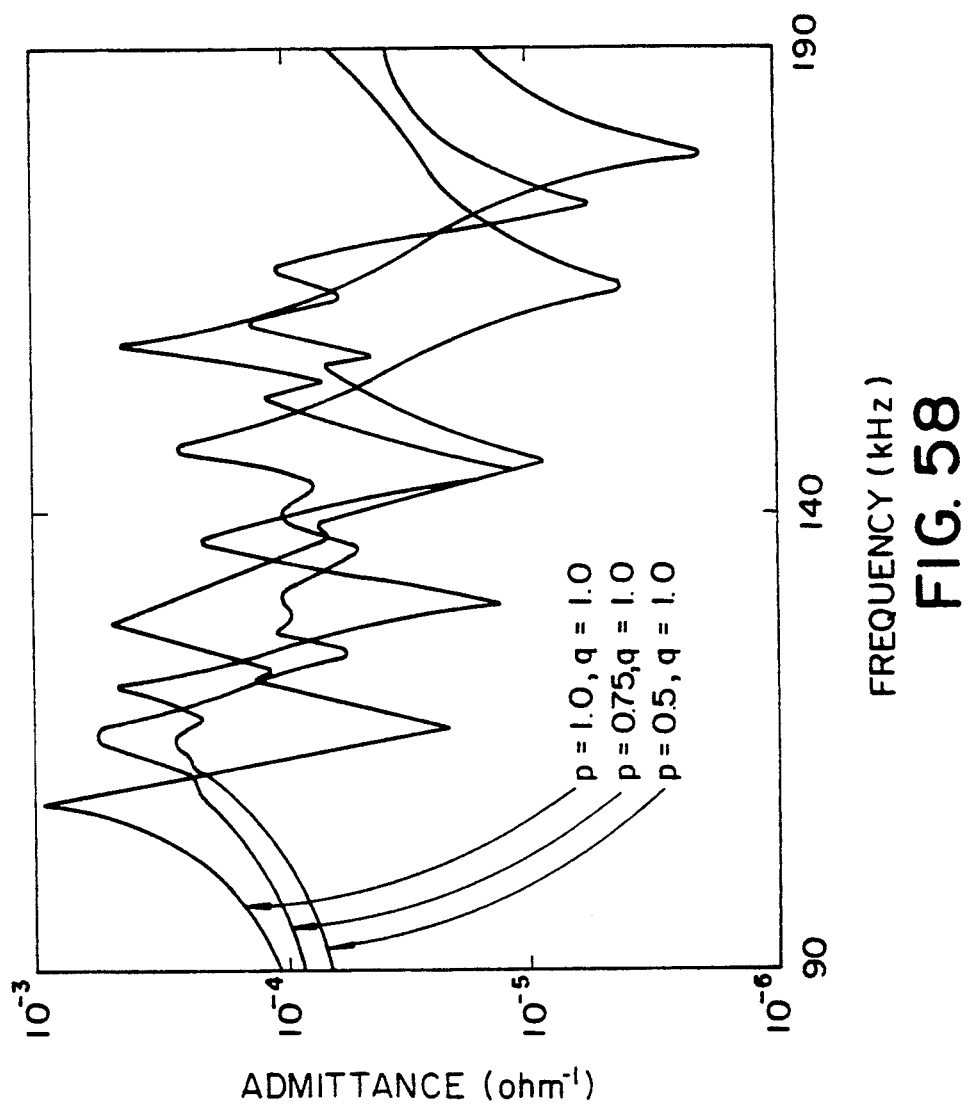
FIG. 58 represents a relationship between the shape ratio (width/length) and the resonance frequency of the piezoelectric vibrator.
Figure 60:
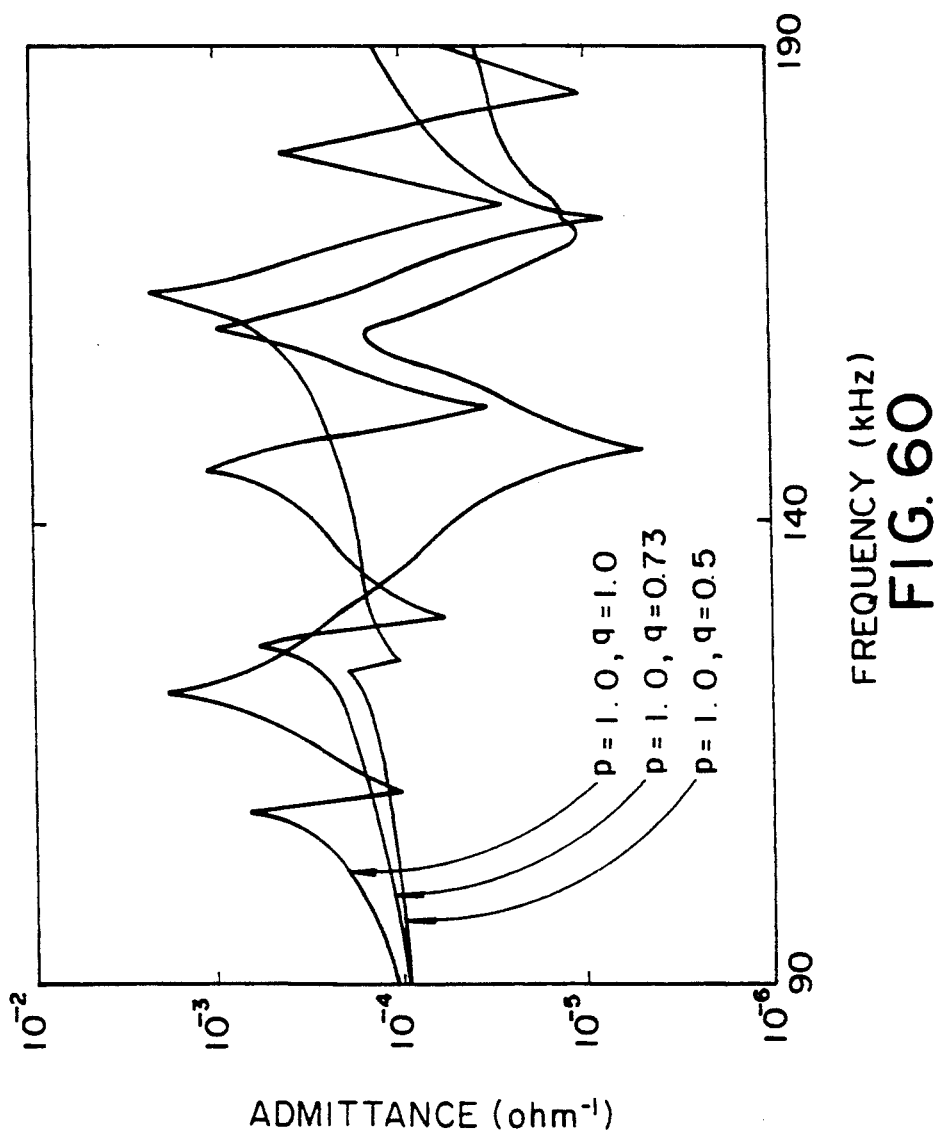
FIG. 60 represents a relationship between the resonance frequency and the shape ratio of the piezoelectric vibrator.

FIGS. 58 and 60 show the relationship between the frequency and the admittance amplitude with shape ratios p and q. Understandable from FIG. 58, the smaller the shape ratio p becomes, the higher the resonance frequency of the piezoelectric vibrator becomes, while maintaining the shape ratio q constant. The lower and higher resonance frequencies of the split frequencies of the piezoelectric vibrator having the shape ratio p=1.0 are 109 kHz and 129 kHz, respectively. The lower resonance frequencies of the piezoelectric vibrators having shape ratios 0.75 and 0.5 are 118 kHz and 122 kHz, respectively. As seen from FIG. 60, the smaller the shape ratio q becomes, the higher the resonance frequency of the piezoelectric vibrator becomes, while maintaining the shape ratio p constant. The lower and higher resonance frequencies of the piezoelectric vibrator 210 having the shape ratio q=0.73 are respectively 127 kHz and 145 kHz. The lower and higher resonance frequencies of the piezoelectric vibrator having shape ratio q=0.5 (L=10 mm, W=10 mm, H=5 mm) are respectively 159 kHz and 180 kHz.

Figure 59:
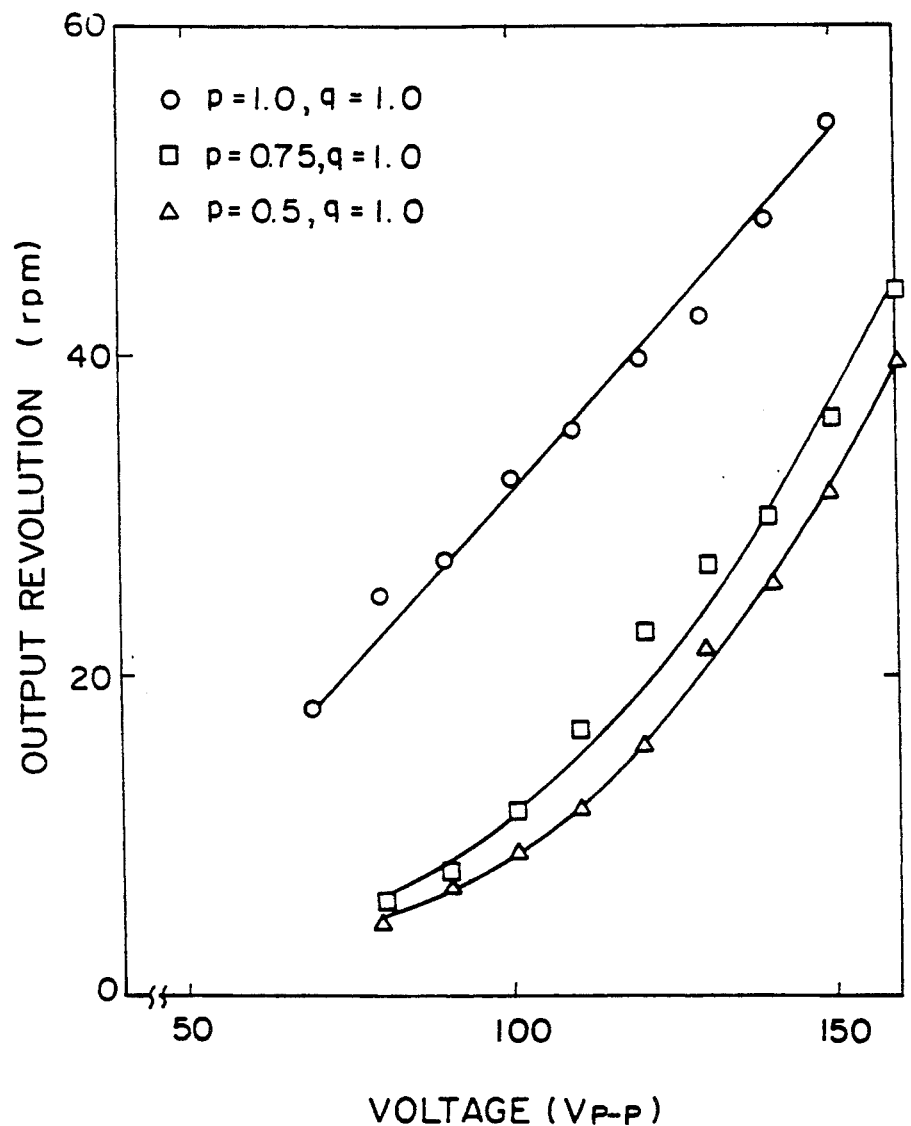
FIG. 59 represents a relationship between the revolution of the vibrator-type actuator and the applied alternating voltage thereto with different shape ratios.

FIGS. 59 and 61 show the relationship between the applied alternating voltage and the revolutions of the vibrator-type actuator with shape parameters p and q. The frequencies of the applied alternating voltages for curves represented by ○, □ and △ are 109 kHz, 118 kHz and 122 kHz, respectively. It is understood from the drawing, that the higher revolution and the larger vibration displacement may be obtained by using the piezoelectric vibrator 10 having the shape ratio 1.0 for the constant applied voltage than by using other vibrators.

In FIG. 61, the frequencies of the applied voltages for the curves represented by ○, φ and ● are 109 kHz, 127 kHz and 159 kHz, respectively. As is clear from FIG. 61, the vibrator-type actuator using the piezoelectric vibrator of the shape ratio q=0.73 may obtain higher output revolution and produce a larger vibration displacement on the side surface than the other vibrator-type actuators. The maximum vibration displacement on the side surface of the piezoelectric vibrator 64 is obtainable when the shape ratios are p=1.0 and q=0.73.

Figure 62:
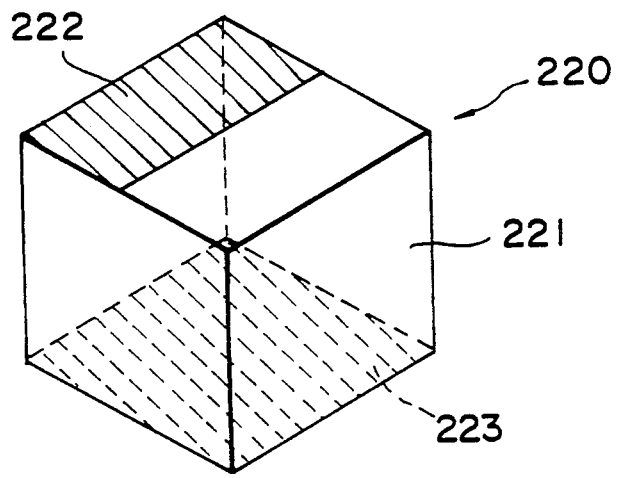
FIGS. 62 and 63 are perspective views of piezoelectric vibrators of the invention.
Figure 63:
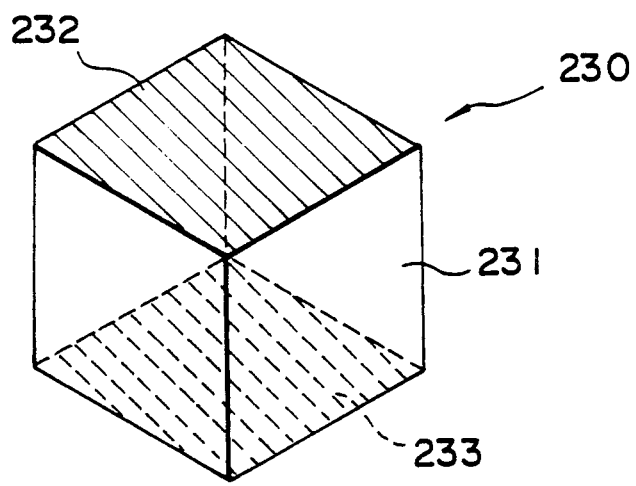

Other embodiments are shown in FIGS. 62 and 63. A piezoelectric vibrator 220 has a piezoelectric body 221 having a length L=10 mm, a width W=10 mm and a height H=10 mm. On one end surface of the piezoelectric body 221 a rectangular electrode 222 is formed, while on the other end surface a square electrode 223 is formed. A piezoelectric vibrator 231 has two electrodes 232, 233 on two end surfaces of the vibrator 230. The electrode 232 covers the whole end surface.

FIG. 64 shows the relationship between the applied alternating voltage and the revolution for the vibrator-type actuators using the piezoelectric vibrators of FIGS. 49, 62 and 63, with the applied signal frequencies 190 kHz, 109 kHz and 114 kHz. Thus a larger vibration displacement is obtainable with increase in asymmetry degree for the constant voltage.

As shown in FIG. 65, the piezoelectric vibrator 240 according to another embodiment includes a cubic piezoelectric body 241 on one end surface on which two separated and isolated electrodes 242A, 242B are formed. The electrodes 242A and 242B have the same rectangular shape and size. Similarly, on the other end surface of the piezoelectric body 241 two separated electrodes 243A and 243B are formed. The electrodes 243A and 242A are symmetrically formed with respect to a plane essentially perpendicular to the axis of the piezoelectric body. The electrodes 243B and 242B are also symmetrically formed with respect to the plane.

The asymmetry of the electrodes is realized by connecting the electrode 242A with the alternating signal source and the electrode 243B to ground. The magnitude and direction of the vibration displacement on the piezoelectric vibrator 240 may be arbitrarily controlled by changing the voltage and frequency of the applied alternating signal.

In another embodiment shown in FIG. 66, a piezoelectric vibrator 250 includes a piezoelectric body 251 on which two electrodes 252, 253 are formed. A cover 254 is formed on the side surface of the piezoelectric body 251. The cover 254 is made of phosphorus bronze and is 50 μm in thickness. This embodiment suppresses the variation of the vibration displacement since the cover 254 is resistant to wear and has a high heat conductivity as was stated before. It is also possible to solder the cover 88 with the support means of the piezoelectric vibrator 86, eliminating any reduction in the transmission efficiency of the vibration displacement to the member to be moved.

Although the invention has been described with respect to specific embodiments, it should be obvious that there are numerous variations within the scope of the present invention. Thus, the present invention intended to cover not only the described embodiments, but also those variations falling within the scope of the appended claims.

What is claimed is:

1. A piezoelectric vibrator comprising:
   a pillar shaped piezoelectric body having two end surfaces essentially perpendicular to a polarization axis of said piezoelectric body;

a first electrode formed completely on one end surface of said piezoelectric body;

a second electrode formed nearly completely on the other end surface of said piezoelectric body; and a cover covering at least a part of a side surface of said piezoelectric body, said cover being formed from a material having high wear resistant and large heat conductivity characteristics.

2. A piezoelectric vibrator as set forth in claim 1, said cover being made from a metal material.

3. A piezoelectric vibrator as set forth in claim 1, said second electrode formed nearly completely on said other end surface being electrically separated into two electrodes.

4. A vibrator-type actuator comprising:

a pillar shaped piezoelectric body having two end surfaces essentially perpendicular to a polarization axis of said piezoelectric body;

a first electrode formed completely on one end surface of said piezoelectric body;

a second electrode formed nearly completely on the other end surface of said piezoelectric body;

a cover covering at least a part of a side surface of said piezoelectric body, said cover being made from a material having high wear resistant and large hat conductive characteristics; and a moving element disposed to contact with said cover in the longitudinal direction of said piezoelectric body.

5. A vibrator-type actuator as set forth in claim 4, said moving element being rotated by vibration displacement caused on the side surface of said cover.

6. A vibrator-type actuator as set forth in claim 4, said moving element being linearly moved by vibration displacement caused on the side surface of said cover.

7. A vibrator-type actuator as set forth in claim 4, further comprising pressing means for pressing said moving element against the side surface of said cover.

8. A vibrator-type actuator comprising:

a pillar shaped piezoelectric body having two end surfaces essentially perpendicular to a polarization axis of said piezoelectric body;

a first electrode formed completely on one end surface of said piezoelectric body;

a second electrode formed nearly completely on the other end surface of said piezoelectric body; and a cover covering at least a part of a side surface of said piezoelectric body, said cover being formed from a material having high wear resistant and large heat conductivity characteristics, said cover being secured to supporting means at a portion of the side surface of said cover where a small vibration displacement is caused.

9. A vibrator-type actuator as set forth in claim 8, said cover and said supporting means being made of metal materials and being welded to each other.

10. A vibrator-type actuator as set forth is claim 8, said cover including a projection portion secured by said supporting means.

11. A piezoelectric vibrator comprising:

a rectangular pillar shaped piezoelectric body polarized in a longitudinal direction; and two electrodes each one formed on a part of respective opposite end surfaces of said piezoelectric body, said electrodes on both end surfaces being formed symmetrically with respect to a central point of said piezoelectric body and asymmetrically with respect to a plane essentially perpendicular to said longitudinal direction.

12. A piezoelectric vibrator as set forth in claim 11, said electrodes being formed on both end surfaces being in symmetry with respect to a center position of said piezoelectric body.

13. A piezoelectric vibrator as set forth in claim 11, said rectangular pillar shape being a square shape.

14. A piezoelectric vibrator as set forth in claim 11, a ratio of the height and width of said rectangular pillar shaped piezoelectric body being about 0.73.

15. A piezoelectric vibrator as set forth in claim 11, further comprising a cover covering at least a part of a side surface of said piezoelectric body, said cover being formed from a material having high wear resistant and large heat conductivity characteristics.

16. A piezoelectric vibrator comprising:

a cylindrical piezoelectric body having a flat side surface along the longitudinal direction of said cylindrical piezoelectric body and two end surfaces essentially perpendicular to a polarization axis of said piezoelectric body;

a first electrode formed completely on one end surface of said piezoelectric body;

a second electrode formed nearly completely on the other end surface of said piezoelectric body; and a cover covering at least a part of a side surface of said piezoelectric body, said cover being formed from a material having high wear resistant and large heat conductivity characteristics.

* * * * *